United States Patent [19]
Miyoshi

[11] Patent Number: 5,942,792
[45] Date of Patent: Aug. 24, 1999

[54] COMPOUND SEMICONDUCTOR DEVICE HAVING A MULTILAYER SILICON STRUCTURE BETWEEN AN ACTIVE REGION AND INSULATOR LAYER FOR REDUCING SURFACE STATE DENSITY AT INTERFACE

[75] Inventor: Yosuke Miyoshi, Tokyo, Japan

[73] Assignee: NEC Corporation, Tokyo, Japan

[21] Appl. No.: 09/071,492

[22] Filed: May 4, 1998

[30] Foreign Application Priority Data

May 2, 1997 [JP] Japan ................................. 9-114605

[51] Int. Cl.[6] ............................................... H01L 31/0328
[52] U.S. Cl. ......................... 257/636; 257/195; 257/200; 257/629; 257/631; 257/646
[58] Field of Search .................................. 257/631, 195, 257/200, 629, 636, 646

[56] References Cited

U.S. PATENT DOCUMENTS 4,935,384  6/1990  Wanlass ................................... 257/631
5,523,592  6/1996  Nakagawa et al. ......................... 257/96
5,679,598  10/1997 Yee .......................................... 438/210

OTHER PUBLICATIONS

Satoshi Kodama et al., Novel Surface Passivation Scheme for Compound Semiconductor Using Silicon Interface Control Layer and its Application to Near–Surface Quantum Wells, pp. 1143–1148, Japan Journal Appl. Phys., Vol. 34, Part 1, No. 2B, Feb. 1995.

*Primary Examiner*—Jerome Jackson, Jr.
*Assistant Examiner*—B William Baumeister
*Attorney, Agent, or Firm*—Young & Thompson

[57] ABSTRACT

A multi-layer structure inserted onto an interface between a compound semiconductor region and a highly resistive material region includes an epitaxial silicon layer up to 1.5 nm thick in contact with the compound semiconductor region and an amorphous silicon layer from 1 to 10 nm thick in contact with the highly resistive material region and laminated on the epitaxial silicon layer.

17 Claims, 32 Drawing Sheets

COMPOUND SEMICONDUCTOR DEVICE HAVING A MULTILAYER SILICON STRUCTURE BETWEEN AN ACTIVE REGION AND INSULATOR LAYER FOR REDUCING SURFACE STATE DENSITY AT INTERFACE

BACKGROUND OF THE INVENTION

The present invention relates to a compound semiconductor device and a method of forming the same.

In manufacturing compound semiconductor devices, mainly silicon and compound semiconductor are used. Compound semiconductors such as GaAs and InP have electron mobilities which are higher than that of silicon, for which reason such the compound semiconductors are widely used for field effect transistors and hetero-junction bipolar transistors for microwave or milliwave devices or integrated circuits.

A conventional high output GaAs metal-semiconductor field effect transistor will be described with reference to FIGS. 1A and 1B. FIG. 1A is a fragmentary plane view illustrative of the conventional high output GaAs metal-semiconductor field effect transistor. FIG. 1B is a fragmentary cross sectional elevation view illustrative of the conventional high output GaAs metal-semiconductor field effect transistor taken along an A–A' line of FIG. 1A.

An n-GaAs active layer 2 is provided on a semi-insulating GaAs substrate 1. The n-GaAs active layer 2 has a recessed portion and ridged portions surrounding the recessed portion. Further, n-GaAs ohmic contact layers 3 are selectively formed on the ridged portions of the n-GaAs active layer 2. A highly resistive silicon dioxide passivation layer 7 acting as passivation is provided over the recessed portion of the n-GaAs active layer 2 and over the n-GaAs ohmic contact layers 3. Openings are provided to penetrate the highly resistive silicon dioxide passivation layer 7 so that a gate electrode 9 of tungsten silicide and source and drain electrodes 10 and 11 of AuGeNi are provided in the openings.

FIG. 2A is a fragmentary plane view illustrative of a conventional GaAs hetero-junction bipolar transistor. FIG. 2B is a fragmentary cross sectional elevation view illustrative of a conventional GaAs hetero-junction bipolar transistor taken along an A–A' line of FIG. 2A.

The conventional hetero-junction bipolar transistor is formed on a semi-insulating GaAs substrate 41. An n-GaAs collector layer 42 is provided on the semi-insulating GaAs substrate 41. A p-GaAs base layer 43 is provided on the n-GaAs collector layer 42. An n-AlGaAs emitter layer 44 is selectively provided on the p-GaAs base layer 43. A tungsten silicide emitter electrode 45 is provided on the n-AlGaAs emitter layer 44. Side wall silicon dioxide layers 46 are provided on side walls of the n-AlGaAs emitter layer 44 and the tungsten silicide emitter electrode 45 as well as over parts of the p-GaAs base layer 43 in the vicinity of the n-AlGaAs emitter layer 44. Further, AuMn base electrodes 49 are provided on the selected parts of the p-GaAs base layer 43 around the side wall silicon dioxide layers 46. An AuGeNi collector electrode 50 is selectively provided within an opening of the p-GaAs base layer 43 and on the n-GaAs collector layer 42.

The above conventional metal-semiconductor field effect transistor and the hetero-junction bipolar transistor have the common boundary structure of the compound semiconductor active region and the insulator passivation region. On such interface between the compound semiconductor active region and the insulator passivation region, a bond disordering is caused on the surface of the compound semiconductor due to inter-diffusion between insulator and compound semiconductor. Further, an oxidation of a surface of the compound semiconductor is caused. Such the bond disordering of the compound semiconductor surface and the surface oxidation thereof generate a large number of surface states.

In the field effect transistor, the surface states act as charge traps for capturing and releasing electrons whereby unstable phenomenons such as gate lag, resulting in deterioration of high frequency performances of the field effect transistor. On the other hands, the elections captured by the charge traps relax the field between the gate and drain whereby the high voltage characteristic of the field effect transistor is improved. Namely, the improvement in high frequency performance and improvement in the high voltage characteristic are in the trade-off relationship.

In the hetero-junction bipolar transistor, the surface states act as recombination centers for electrons and holes, for which reason as the bipolar transistor is scaled down, a ratio of the recombination current to the base current is increased, resulting in a drop of the current gain. Namely, the emitter side effects are caused.

To settle the above problems, it is necessary to provide a surface passivation for reduction in the surface state density. One of the passivation technique for reduction in the surface state density has been known and disclosed in Japanese journal of Applied Physics, Vol. 34, pp. 1143–1148, February 1995, wherein a thin epitaxial silicon layer of 1 nanometers in thickness is epitaxially grown on a compound semiconductor substrate for pseudo lattice matching between silicon and compound semiconductor before an insulation passivation layer is deposited on the epitaxial silicon layer.

Fabrication processes for the above passivation on the GaAs substrate will be described with reference to FIGS. 3A through 3C.

With reference to FIG. 3A, an epitaxial silicon layer 52 is epitaxially grown by a molecular beam epitaxy method on a GaAs substrate 51. The maximum thickness of the epitaxial silicon layer 52 is about 1 nanometer.

With reference to FIG. 3B, a silicon nitride layer 53 of about 1.5 nanometers in thickness is formed on the epitaxial silicon layer 52 in a photo-CVD system coupled through the same vacuum system to the molecular beam epitaxy system.

With reference to FIG. 3C, a silicon oxide film 54 is deposited by the photo-CVD method on the silicon nitride layer 53.

In the above passivation method, the epitaxial silicon layer 52 is pseudo lattice-matched with the GaAs substrate 51, for which reason on the interface between the epitaxial silicon layer 52 and the GaAs substrate 51, no bonding disordering is caused. Further, the silicon nitride layer 53 serves as an oxidation barrier layer which prevents oxidation of the epitaxial silicon layer 52 and the GaAs substrate 51 during the formation of the silicon oxide layer 54. Therefore, the increase in surface state density due to the interface bonding disordering and oxidation is suppressed.

The above surface passivation is, however, enagaged with the following problems. In order to prevent oxidation of the epitaxial silicon layer 52 during the formation of the silicon nitride layer 53, it is necessary that the epitaxial silicon layer 52 and the silicon nitride latter 53 are formed in the same vacuum system. This, however, results in scale up of the system and makes the system complicated as well as results in complicated processes and drop of the throughput of the device. In the normal systems, sample carrying paths other than process chambers have a vacuum in the order of $10^{-4}$ Torr. When the wafer is moved from the molecular beam epitaxy chamber to the photo-CVD chamber, the surface of the epitaxial silicon layer 52 may be oxidized. In order to prevent such oxidation of the epitaxial silicon layer 52 during carrying from the molecular beam epitaxy chamber to the photo-CVD chamber, it is required to keep the carrying path between the molecular beam epitaxy chamber and the photo-CVD chamber in a high vacuum state. Actually, however, it is difficult to maintain such ideal system.

Furthermore, when the GaAs field effect transistor is operated for a long time, an electrochemical reaction is caused at an edge of the gate in the vicinity of the drain whereby an oxidation of the GaAs active layer is caused. The above described conventional field effect transistors allow oxidation of the epitaxial silicon layers.

Moreover, in the above described conventional passivation technique, the epitaxial silicon layer is entirely formed on the wafer, for which reason it is impossible to form integration of a high frequency field effect transistor and a high voltage field effect transistor on the single wafer.

In the above circumstances, it had been required to develop a novel compound semiconductor device free from the above problems.

SUMMARY OF THE INVENTION

Accordingly, it is an object of the present invention to provide a novel compound semiconductor device free from the above problems It is a further object of the present invention to provide a novel method of forming a compound semiconductor device free from the above problems The above and other objects, features and advantages of the present invention will be apparent from the following descriptions.

The present invention provides a multi-layer structure inserted onto an interface between a compound semiconductor region and a highly resistive material region. The multi-layer structure comprises an epitaxial silicon layer being provided in contact with the compound semiconductor region; and an amorphous silicon layer provided in contact with the highly resistive material region and being laminated on the epitaxial silicon layer

BRIEF DESCRIPTION OF THE DRAWINGS

Preferred embodiments according to the present invention will be described in detail with reference to the accompanying drawings.

DISCLOSURE OF THE INVENTION

Figure 1A:
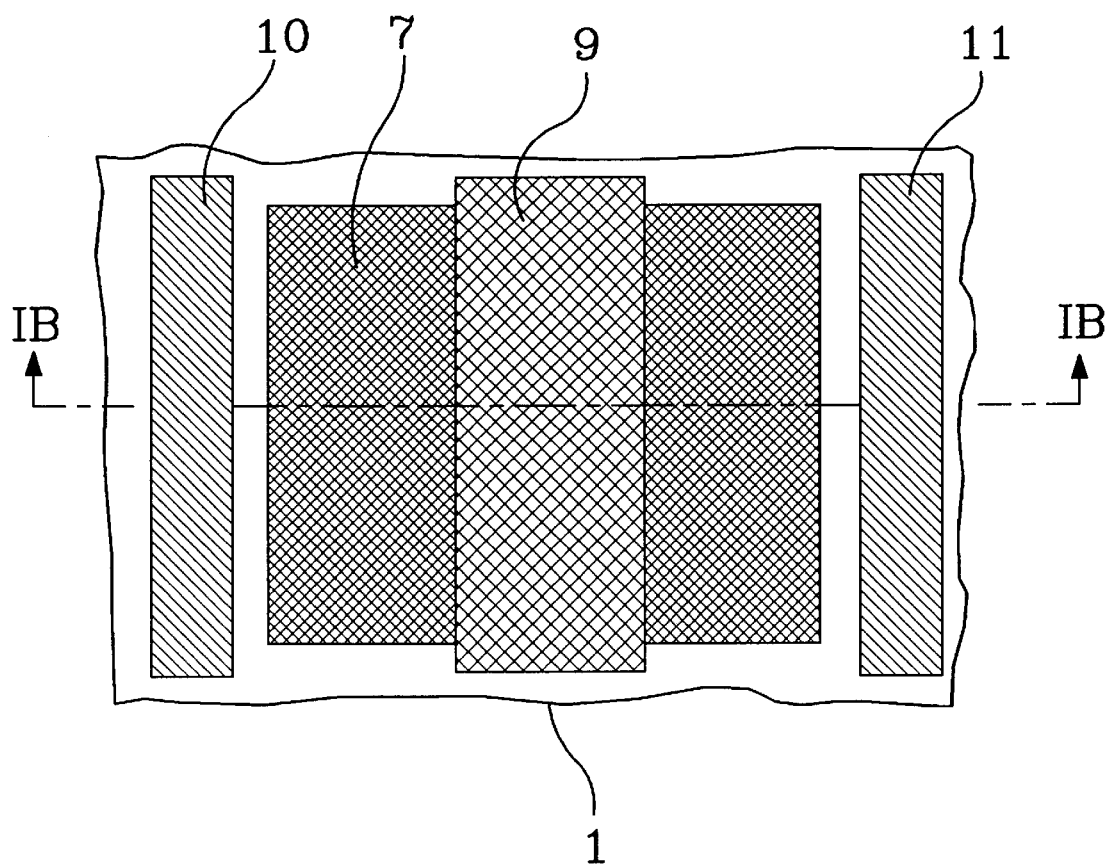
FIG. 1A is a fragmentary plane view illustrative of the conventional high output GaAs metal-semiconductor field effect transistor.
Figure 1B:
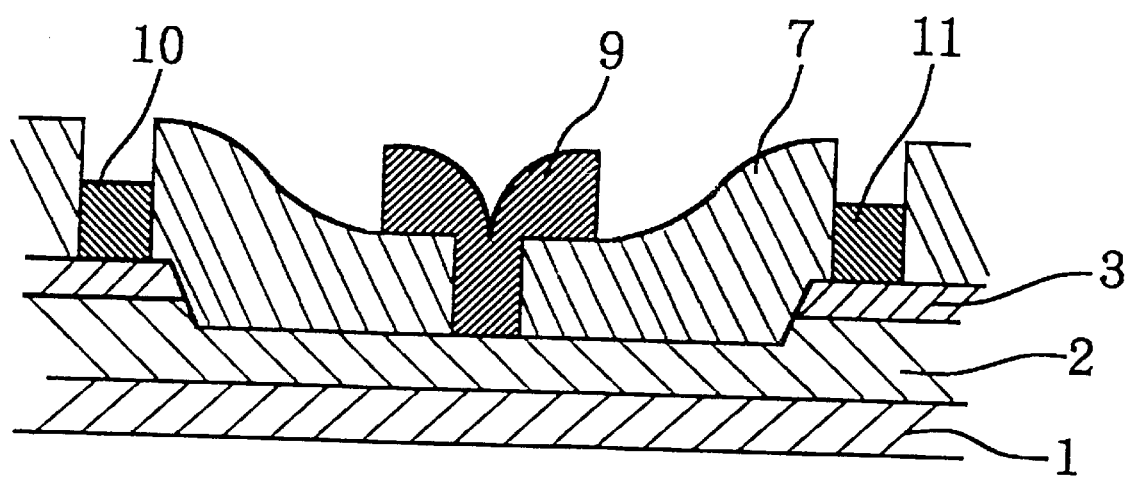
FIG. 1B is a fragmentary cross sectional elevation view illustrative of the conventional high output GaAs metal-semiconductor field effect transistor taken along an A–A' line of FIG. 1A.
Figure 2A:
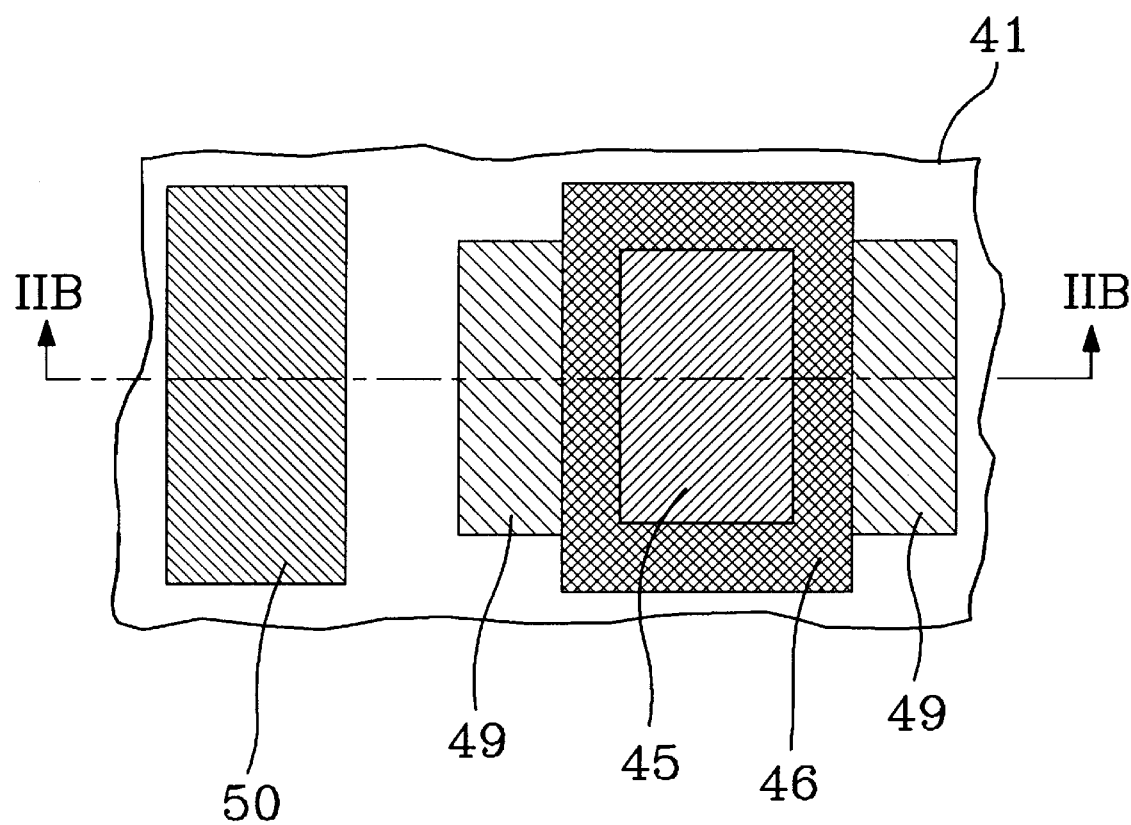
FIG. 2A is a fragmentary plane view illustrative of a conventional GaAs hetero-junction bipolar transistor.
Figure 2B:
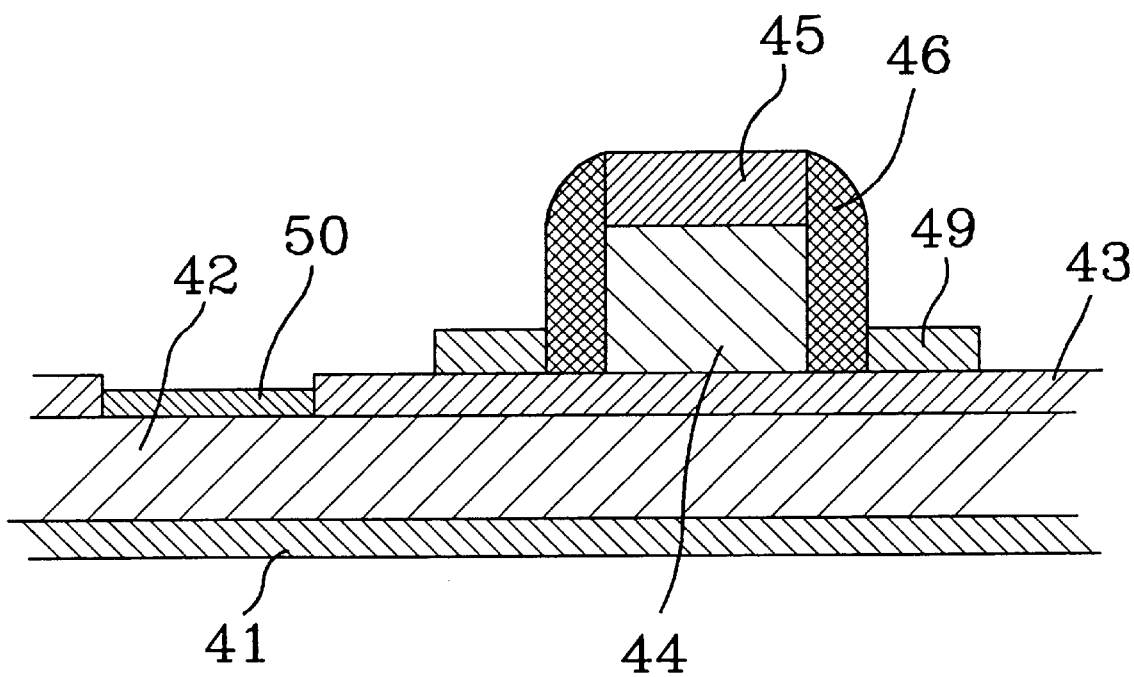
FIG. 2B is a fragmentary cross sectional elevation view illustrative of a conventional GaAs hetero-junction bipolar transistor taken along an A–A' line of FIG. 2A.
Figure 3A:
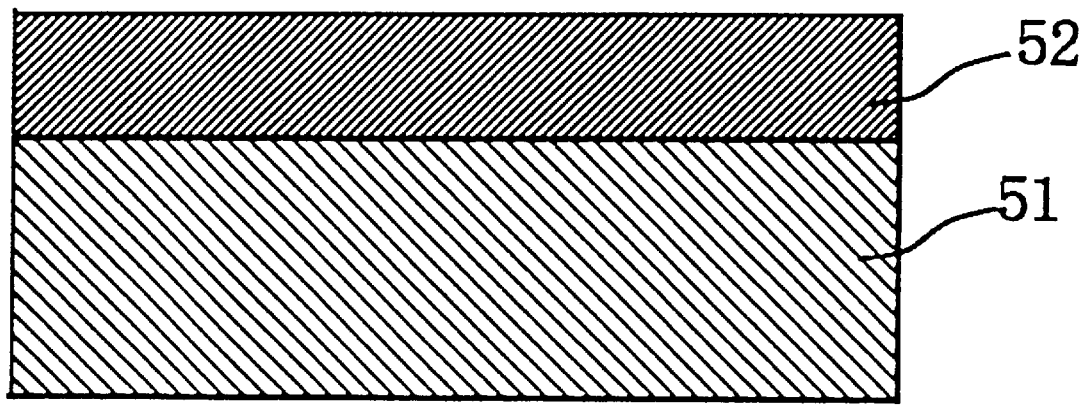
FIGS. 3A through 3C are fragmentary cross sectional elevation views illustrative of GaAs substrates in sequential steps involved in the conventional passivation technique.
Figure 3B:
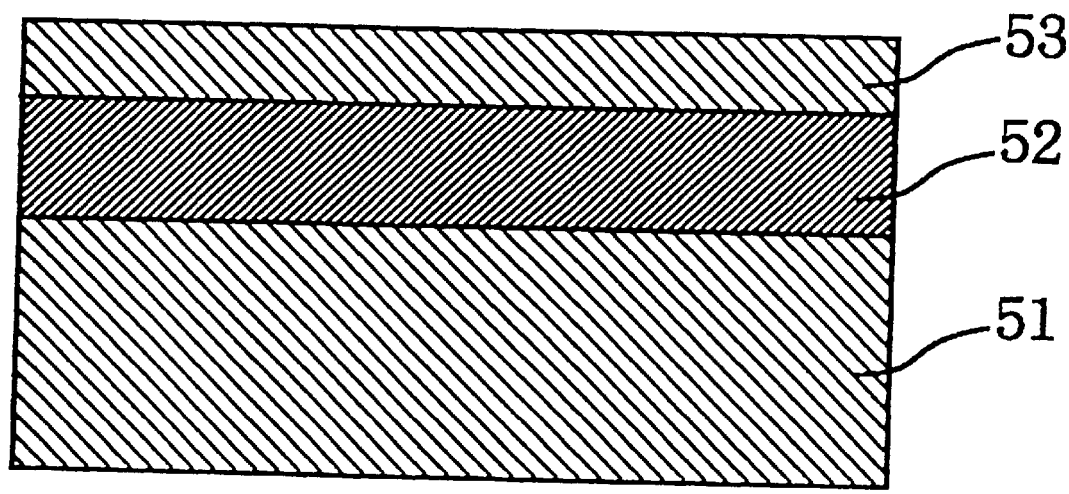
Figure 3C:
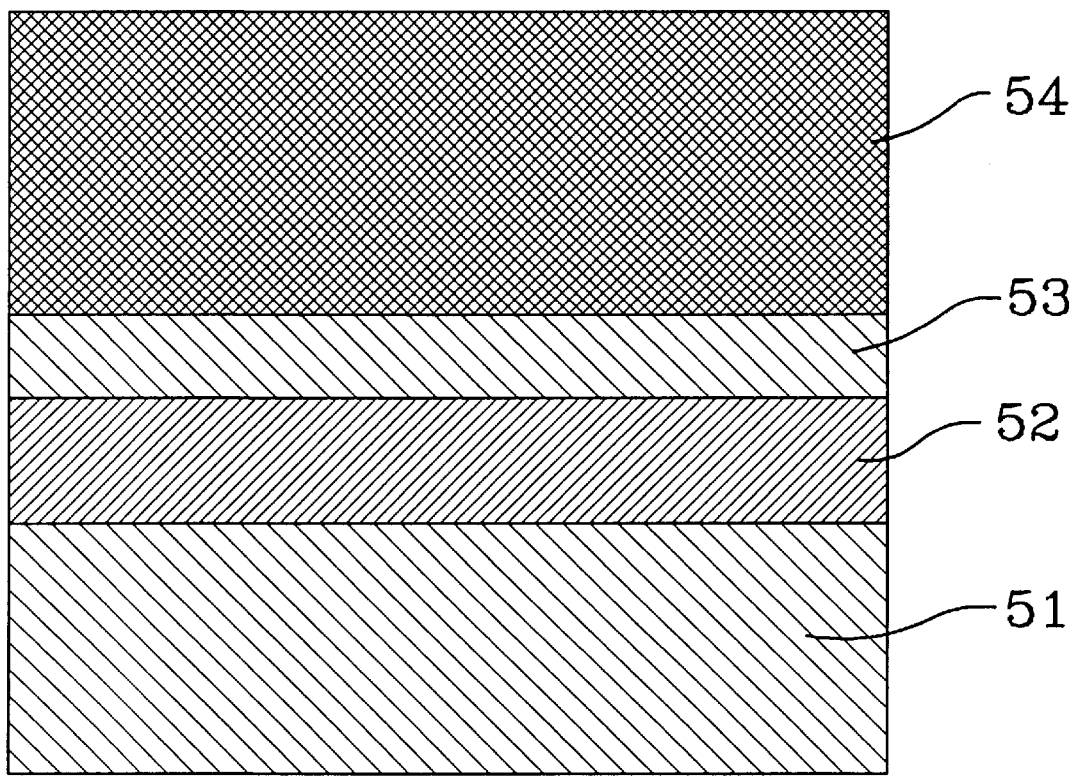

The first present invention provides a multi-layer structure inserted onto an interface between a compound semiconductor region and a highly resistive material region. The multi-layer structure comprises an epitaxial silicon layer being provided in contact within the compound semiconductor region; and an amorphous silicon laser provided in contact with the highly resistive material region and being laminated on the epitaxial silicon layer.

The epitaxial silicon layer in contact with the compound semiconductor region serves as an interface control layer. The amorphous silicon layer laminated on the epitaxial silicon layer serves as an oxidation buffer layer. The highly resistive material region in contact with the amorphous silicon layer serves as a passivation. The above laminations of the epitaxial silicon layer and the amorphous silicon layer between the compound semiconductor region and the highly resistive material region are capable of preventing disordering of atomic bonding structures on the surface of the compound semiconductor region and also capable of preventing the oxidation of the surface of the compound semiconductor region. Since increase in the surface state density possessed by the surface or interface of the compound semiconductor region is caused by the disordering of atomic bonding structures on the surface of the compound semiconductor region and also caused by the oxidation of the surface of the compound semiconductor region, then prevention of the disordering of atomic bonding structures on the surface of the compound semiconductor region and of the oxidation of the surface of the compound semiconductor region results in reduction in the surface state density. Namely, the above lamination structure of the epitaxial silicon layer and the amorphous silicon layer between the compound semiconductor region and the highly resistive material region is capable of a substantive reduction in the surface state density.

The above novel multi-layer structure is applicable to the semiconductor devices of various types. If the above novel multi-layer structure is applicable to field effect transistors, the following advantages can be obtained. The surface states serve as charge traps for catching and releasing charges such as electrons, for which reason at high density of surface state causes unstable phenomenons such as gate lag which deteriorate high frequency performances of the field effect transistors. On the other hand, electrons caught in the traps relax a field between the gate and drain of the field effect transistor, resulting in high voltage characteristics of the field effect transistor. The high frequency performances and the high voltage characteristics are in trade-off relationship. If the field effect transistor is required to have high frequency performances, the above novel multi-layer structure is provided onto the interface between the compound semiconductor region and the highly resistive region so as to reduce the surface state density by prevention of the disordering of atomic bonding structures on the surface of the compound semiconductor region and also by prevention of the oxidation of the surface of the compound semiconductor region.

If the above novel multi-layer structure is applicable to bipolar transistors, the following advantages can be obtained. The surface states serve as recombination centers for electrons and holes. As the bipolar transistor is required to be scaled down, a ratio of a recombination current to a base current is increased. For this reason, the realization of scaling down the bipolar transistor requires a reduction in ratio of the recombination current to the base current. The reduction in ratio of the recombination current to the base current requires reduction in density of the surface states. The above laminations of the epitaxial silicon layer and the amorphous silicon layer between the compound semiconductor legion and the highly resistive material region are capable of preventing disordering of atomic bonding structures on the surface of the compound semiconductor region and also capable of preventing the oxidation of the surface of the compound semiconductor region. Since increase in the surface state density possessed by the surface or interface of the compound semiconductor region is caused by the disordering of atomic bonding structures on the surface of the compound semiconductor region and also caused by the oxidation of the surface of the compound semiconductor region, then prevention of the disordering of atomic bonding structures on the surface of the compound semiconductor region and of the oxidation of the surface of the compound semiconductor region results in reduction in the surface state density. Namely, the above lamination structure of the epitaxial silicon layer and the amorphous silicon layer between the compound semiconductor region and the highly resistive material region is capable of a substantive reduction in the surface state density. Therefore, the above lamination structure of the epitaxial silicon layer and the amorphous silicon layer between the compound semiconductor region and the highly resistive material region is capable of reduction in ratio of the recombination current to the base current. This reduction in ratio of the recombination current to the base current causes an increase in the current gain of the bipolar transistor.

In any events, if the compound semiconductor devices are required to have reduced density of surface states, the above described novel multi-layer structure of the epitaxial silicon layer and the amorphous silicon layer between the compound semiconductor region and the highly resistive material region is useful. For this reason, the novel multi-layer structure is applicable to any compound semiconductor devices which are required to have reduced density of surface states for exhibiting various required performances.

The above epitaxial silicon layer and the amorphous silicon layer may be continuously grown in the same molecular beam epitaxy chamber by merely changing growth condition such as substrate temperature. This makes the fabrication processes simple. No throughput drop is caused. The manufacturing apparatus is free from the requirements for scaling up and complicated structure. There is no need to carry the wafer to other apparatus after the epitaxial silicon layer has been grown and before the amorphous silicon layer will be grown. This prevents any oxidation of the surface of the epitaxial silicon layer.

If the compound semiconductor device is GaAs field effect transistor, no oxidation is cased for no electrochemical reaction on the compound semiconductor active region even after along time operation of the transistor. The above novel multi-layer structure makes the GaAs field effect transistor free from any substantive deterioration of the performances and characteristics due to the long time operation thereof.

It is preferable that the highly resistive material region comprises an insulation region. In this case, it is further preferable that the insulation region is a silicon oxide region. In this case, it is furthermore preferable to provide a silicon nitride layer between the amorphous silicon layer and the silicon oxide region.

Alternatively, it is also preferable that the insulation region is a silicon nitride region. The silicon nitride region may preferably be grown by a compound of nitrogen and hydrogen such as $NH_3$ gas so that prior to the growth of nitride region, a spontaneous oxide film and impurities such as carbon and sulfur can be removed from a surface of the amorphous silicon region, before the cleaned surface of the amorphous silicon region as an oxidation buffer region is nitrated, resulting in no problem being raised with the gate lag.

It is also preferable that the epitaxial silicon layer has a thickness in the range of a mono-atomic silicon layer thickness to about 1.5 nanometers. In this case, it is further preferable that the epitaxial silicon layer has a thickness of about 1.0 nanometer.

It is also preferable that the amorphous silicon layer has a thickness of not less than 1 nanometer.

It is also preferable that the compound semiconductor region comprises an active region provided on a compound semiconductor substrate.

It is also preferable that the compound semiconductor region comprises a first active region and a second active region, wherein the multi-layer structure is provided on the first active region and a compound semiconductor oxide layer is provided on the second active region and a silicon oxide layer is laminated on the compound semiconductor oxide layer, whereby the field effect transistor required to have the high frequency performances is formed on the first active region whilst the field effect transistor required to have the high voltage characteristic is formed on the second active region.

The second present invention provides a multi-layer structure in a semiconductor device, comprising: a compound semiconductor active layer being provided over a compound semiconductor substrate, an epitaxial silicon layer being provided on the compound semiconductor active layer; an amorphous silicon layer being laminated on the epitaxial silicon layer; and a highly resistive material layer being provided on the amorphous silicon layer.

The epitaxial silicon layer in contact with the compound semiconductor layer serves as an interface control layer. The amorphous silicon layer laminated on the epitaxial silicon layer serves as an oxidation buffer layer. The highly resistive material layer in contact with the amorphous silicon layer serves as a passivation. The above laminations of the epitaxial silicon layer and the amorphous silicon layer between the compound semiconductor layer and the highly resistive material layer are capable of preventing disordering of atomic bonding structures on the surface of the compound semiconductor layer and also capable of preventing the oxidation of the surface of the compound semiconductor layer. Since increase in the surface state density possessed by the surface or interface of the compound semiconductor layer is caused by the disordering of atomic bonding structures on the surface of the compound semiconductor layer and also caused by the oxidation of the surface of the compound semiconductor layer, then prevention of the disordering of atomic bonding structures on the surface of the compound semiconductor layer and of the oxidation of the surface of the compound semiconductor layer results in reduction in the surface state density. Namely, the above lamination structure of the epitaxial silicon layer and the amorphous silicon layer between the compound semiconductor layer and the highly resistive material layer is capable of a substantive reduction in the surface state density.

The above novel multi-layer structure is applicable to the semiconductor devices of various types. If the above novel multi-layer structure is applicable to field effect transistors, the following advantages can be obtained. The surface states serve as charge traps for catching and releasing charges such as electrons, for which reason a high density of surface state causes unstable phenomenons such as gate lag which deteriorate high frequency performances of the field effect transistors. On the other hand, electrons caught in the traps relax a field between the gate and drain of the field effect transistor, resulting in high voltage characteristics of the field effect transistor The high frequency performances and the high voltage characteristics are in trade-off relationship. If the field effect transistor is required to have high frequency performances, the above novel multi-layer structure is provided onto the interface between the compound semiconductor layer and the highly resistive layer so as to reduce the surface state density by prevention of the disordering of atomic bonding structures on the surface of the compound semiconductor layer and also by prevention of the oxidation of the surface of the compound semiconductor layer.

If the above novel multi-layer structure is applicable to bipolar transistors, the following advantages can be obtained. The surface states serve as recombination centers for electrons and holes. As the bipolar transistor is required to be scaled down, a ratio of a recombination current to a base current is increased. For this reason, the realization of scaling down the bipolar transistor requires a reduction in ratio of the recombination current to the base current. The reduction in ratio of the recombination current to the base current requires reduction in density of the surface states. The above laminations of the epitaxial silicon layer and the amorphous silicon layer between the compound semiconductor layer and the highly resistive material layer are capable of preventing disordering of atomic bonding structures on the surface of the compound semiconductor layer and also capable of preventing the oxidation of the surface of the compound semiconductor layer. Since increase in the surface state density possessed by the surface or interface of the compound semiconductor layer is caused by the disordering of atomic bonding structures on the surface of the compound semiconductor layer and also caused by the oxidation of the surface of the compound semiconductor layer, then prevention of the disordering of atomic bonding structures on the surface of the compound semiconductor layer and of the oxidation of the surface of the compound semiconductor layer results in reduction in the surface state density. Namely, the above lamination structure of the epitaxial silicon layer and the amorphous silicon layer between the compound semiconductor layer and the highly resistive material layer is capable of a substantive reduction in the surface state density. Therefore, the above lamination structure of the epitaxial silicon layer and the amorphous silicon layer between the compound semiconductor layer and the highly resistive material layer is capable of reduction in ratio of the recombination current to the base current. This reduction in ratio of the recombination current to the base current causes an increase in the current gain of the bipolar transistor In any events, if the compound semiconductor devices are required to have reduced density of surface states, the above described novel multi-layer structure of the epitaxial silicon layer and the amorphous silicon layer between the compound semiconductor layer and the highly resistive material layer is useful. For this reason, the novel multi-layer structure is applicable to any compound semiconductor devices which are required to have reduced density of surface states for exhibiting various required performances.

The above epitaxial silicon layer and the amorphous silicon layer may be continuously grown in the same molecular beam epitaxy chamber by merely changing growth condition such as substrate temperature. This makes the fabrication processes simple. No throughput drop is caused. The manufacturing apparatus is free from the requirements for scaling up and complicated structure. There is no need to carry the wafer to other apparatus after the epitaxial silicon layer has been grown and before the amorphous silicon layer will be grown. This prevents any oxidation of the surface of the epitaxial silicon layer.

If the compound semiconductor device is GaAs field effect transistor, no oxidation is cased for no electrochemical reaction on the compound semiconductor active layer even after along time operation of the transistor. The above novel multi-layer structure, makes the GaAs field effect transistor free from any substantive deterioration of the performances and characteristics due to the long time operation thereof.

It is preferable that the highly resistive material layer comprises an insulation layer. In this case, it is further preferable that the insulation layer is a silicon oxide layer. In this case, it is furthermore preferable to provide a silicon nitride layer between the amorphous silicon layer and the silicon oxide layer.

Alternatively, it is also preferable that the insulation layer is a silicon nitride layer. The silicon nitride region may preferably be grown by a compound of nitrogen and hydrogen such as $NH_3$ gas so that prior to the growth of nitride layer, a spontaneous oxide film and impurities such as carbon and sulfur can be removed from a surface of the amorphous silicon layer, before the cleaned surface of the amorphous silicon layer as an oxidation buffer layer is nitrated, resulting in no problem being raised with the gate lag.

It is also preferable that the epitaxial silicon layer has a thickness in the range of a mono-atomic silicon layer thickness to about 1.5 nanometers. In this case, it is further preferable that the epitaxial silicon layer has a thickness of about 1.0 nanometer.

It is also preferable that the amorphous silicon layer has a thickness of not less than 1 nanometer.

It is also preferable that the compound semiconductor active region comprises a first active region and a second active region, wherein the multi-layer structure is provided on the first active region and a compound semiconductor oxide layer is provided on the second active region and a silicon oxide layer is laminated on the compound semiconductor oxide layer, whereby the field effect transistor required to have the high frequency performances is formed on the first active region whilst the field effect transistor required to have the high voltage characteristic is formed on the second active region.

The third present invention provides a method of forming a multi-layer structure on an interface between a compound semiconductor region and a highly resistive material region. The method comprises the following steps. An epitaxial silicon layer is epitaxially grown on the compound semiconductor region. An amorphous silicon layer is grown on the epitaxial silicon layer. A highly resistive material region is provided on the amorphous silicon layer.

The epitaxial silicon layer in contact with the compound semiconductor layer serves as an interface control layer. The amorphous silicon layer laminated on the epitaxial silicon layer serves as an oxidation buffer layer. The highly resistive material layer in contact with the amorphous silicon layer serves as a passivation. The above laminations of the epitaxial silicon layer and the amorphous silicon layer between the compound semiconductor layer and the highly resistive material layer are capable of preventing disordering of atomic bonding structures on the surface of the compound semiconductor layer and also capable of preventing the oxidation of the surface of the compound semiconductor layer. Since increase in the surface state density possessed by the surface or interface of the compound semiconductor layer is caused by the disordering of atomic bonding structures on the surface of the compound semiconductor layer and also caused by the oxidation of the surface of the compound semiconductor layer, then prevention of the disordering of atomic bonding structures on the surface of the compound semiconductor layer and of the oxidation of the surface of the compound semiconductor layer results in reduction in the surface state density. Namely, the above lamination structure of the epitaxial silicon layer and the amorphous silicon layer between the compound semiconductor layer and the highly resistive material layer is capable of a substantive reduction in the surface state density.

The above novel multi-layer structure is applicable to the semiconductor devices of various types. If the above novel multi-layer structure is applicable to field effect transistors, the following advantages can be obtained. The surface states serve as charge traps for catching and releasing charges such as electrons, for which reason a high density of surface state causes unstable phenomenons such as gate lag which deteriorate high frequency performances of the field effect transistors. On the other hand, electrons caught in the traps relax a field between the gate and drain of the field effect transistor, resulting in high voltage characteristics of the field effect transistor. The high frequency performances and the high voltage characteristics are in trade-off relationship. If the field effect transistor is required to have high frequency performances, the above novel multi-layer structure is provided onto the interface between the compound semiconductor layer and the highly resistive layer so as to reduce the surface state density by prevention of the disordering of atomic bonding structures on the surface of the compound semiconductor layer and also by prevention of the oxidation of the surface of the compound semiconductor layer.

If the above novel multi-layer structure is applicable to bipolar transistors, the following advantages can be obtained. The surface states serve as recombination centers for electrons and holes. As the bipolar transistor is required to be scaled down, a ratio of a recombination current to a base current is increased. For this reason, the realization of scaling down the bipolar transistor requires a reduction in ratio of the recombination current to the base current. The reduction in ratio of the recombination current to the base current requires reduction in density of the surface states. The above laminations of the epitaxial silicon layer and the amorphous silicon layer between the compound semiconductor layer and the highly resistive material layer are capable of preventing disordering of atomic bonding structures on the surface of the compound semiconductor layer and also capable of preventing the oxidation of the surface of the compound semiconductor layer. Since increase in the surface state density possessed by the surface or interface of the compound semiconductor layer is caused by the disordering of atomic bonding structures on the surface of the compound semiconductor layer and also caused by the oxidation of the surface of the compound semiconductor layer, then prevention of the disordering of atomic bonding structures on the surface of the compound semiconductor layer and of the oxidation of the surface of the compound semiconductor layer results in reduction in the surface state density. Namely, the above lamination structure of the epitaxial silicon layer and the amorphous silicon layer between the compound semiconductor layer and the highly resistive material layer is capable of a substantive reduction in the surface state density. Therefore, the above lamination structure of the epitaxial silicon layer and the amorphous silicon layer between the compound semiconductor layer and the highly resistive material layer is capable of reduction in ratio of the recombination current to the base current. This reduction in ratio of the recombination current to the base current causes an increase in the current gain of the bipolar transistor.

In any events, if the compound semiconductor devices are required to have reduced density of surface states, the above described novel multi-layer structure of the epitaxial silicon layer and the amorphous silicon layer between the compound semiconductor layer and the highly resistive material layer is useful. For this reason, the novel multi-layer structure is applicable to any compound semiconductor devices which are required to have reduced density of surface states for exhibiting various required performances.

The above epitaxial silicon layer and the amorphous silicon layer may be continuously grown in the same molecular beam epitaxy chamber by merely changing growth condition such as substrate temperature. This makes the fabrication processes simple. No throughput drop is caused. The manufacturing apparatus is free from the requirements for scaling up and complicated structure. There is no need to carry the wafer to other apparatus after the epitaxial silicon layer has been grown and before the amorphous silicon layer will be grown. This prevents any oxidation of the surface of the epitaxial silicon layer.

If the compound semiconductor device is GaAs field effect transistor, no oxidation is cased for no electrochemical reaction on the compound semiconductor active layer even after along time operation of the transistor. The above novel multi-layer structure makes the GaAs field effect transistor free from any substantive deterioration of the performances and characteristics due to the long time operation thereof.

It is preferable that the highly resistive material region comprises an insulation region. In this case, it is further preferable that the insulation region is a silicon oxide region.

It is also preferable that in an epitaxial growth chamber, the epitaxial silicon layer is grown at a substrate temperature in the range of 250° C. to 450° C. and subsequently the amorphous silicon layer is grown at about 200° C.

It is also preferable to further add a step of nitrating a surface of the amorphous silicon layer to form a silicon nitride layer on the amorphous silicon layer for subsequent formation of the silicon oxide region on the silicon nitride layer. The silicon nitride layer may preferably be grown by a compound of nitrogen and hydrogen such as $NH_3$ gas so that prior to the growth of nitride layer, a spontaneous oxide film and impurities such as carbon and sulfur can be removed from a surface of the amorphous silicon layer, before the cleaned surface of the amorphous silicon layer as an oxidation buffer layer is nitrated, resulting in no problem being raised with the gate lag.

It is also preferable that the insulation region is a silicon nitride region. In this case, it is also preferable to further add a step of cleaning a surface of the amorphous silicon layer with $NH_3$ gas before the silicon nitride region is formed with $NH_3$ gas and $SiH_4$ gas.

It is also preferable that the cleaning and subsequent formation of the silicon nitride region are carried out at the same substrate temperature and in the same chemical vapor deposition chamber.

PREFERRED EMBODIMENTS

FIRST EMBODIMENT

Figure 4A:
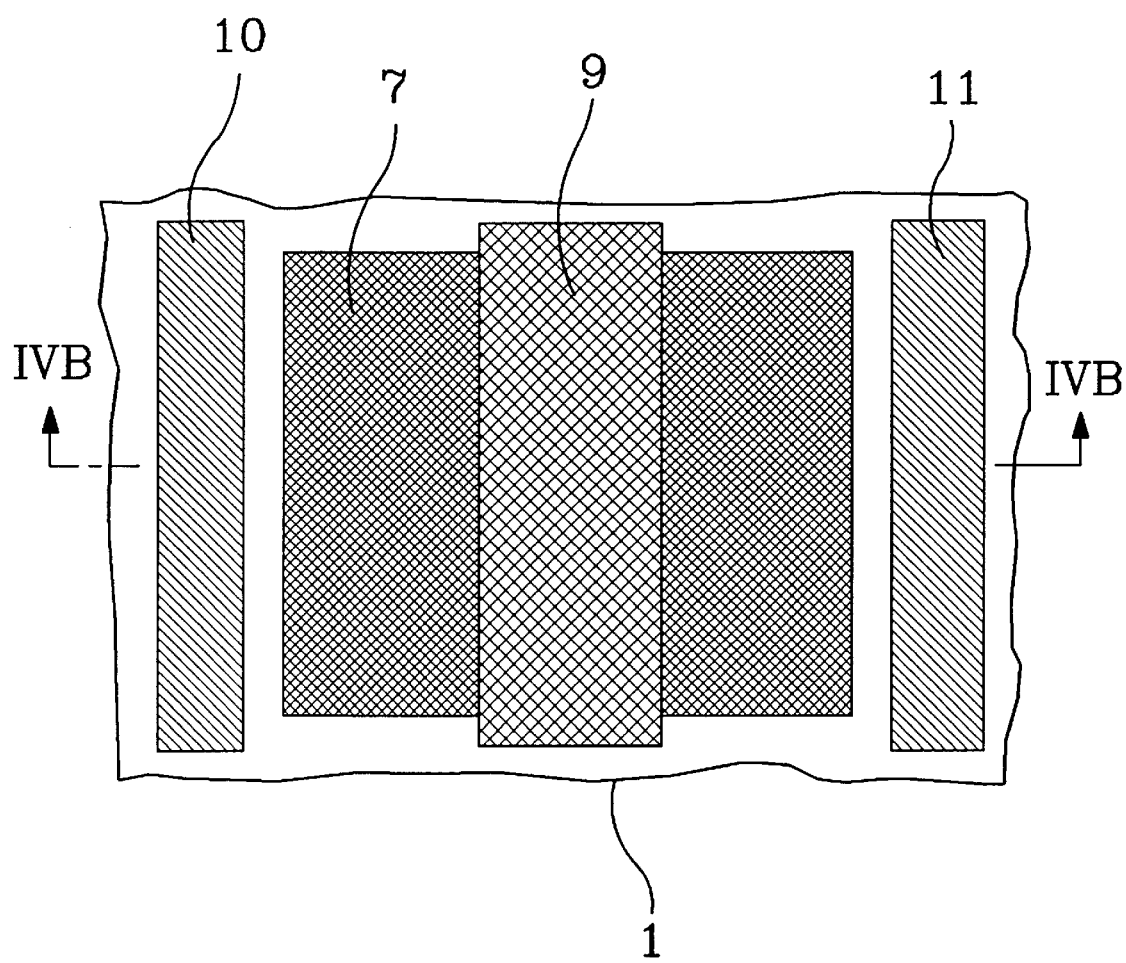
FIG. 4A is a fragmentary plane view illustrative of a novel metal-semiconductor field effect transistor having an improved multi-layer structure inserted onto an interface between a compound semiconductor active layer and a silicon oxide passivation layer in a first embodiment according to the present invention.
Figure 4B:
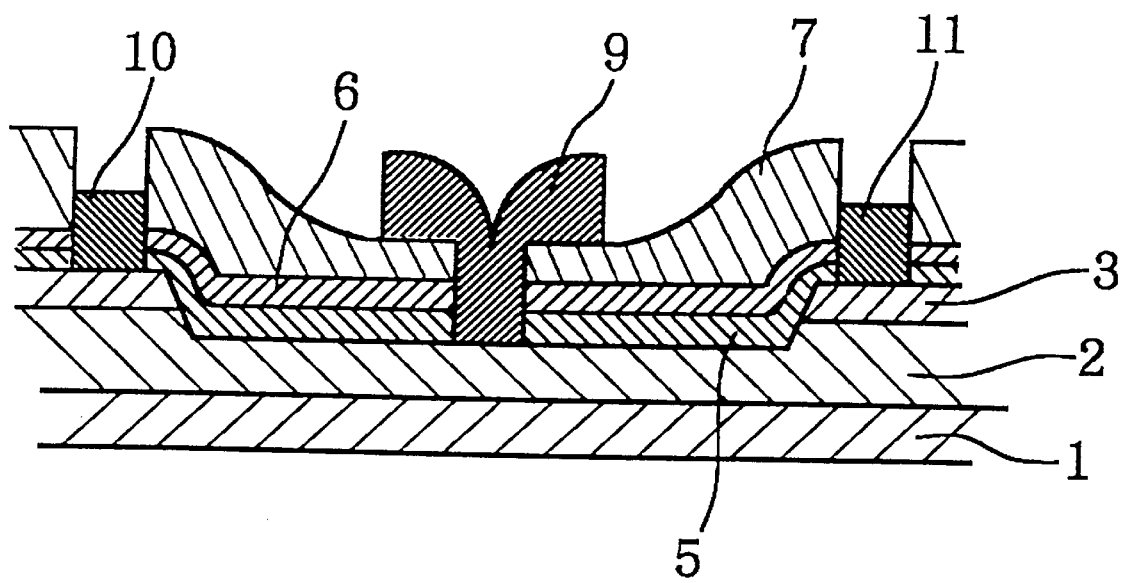
FIG. 4B is a fragmentary cross sectional elevation view illustrative of a novel metal-semiconductor field effect transistor having an improved multi-layer structure inserted onto an interface between a compound semiconductor active layer and a silicon oxide passivation layer taken along an A–A' line of FIG. 4A in a first embodiment according to the present invention.

A first embodiment according to the present invention will be described in detail with reference to FIGS. 4A and 4B, wherein a novel metal-semiconductor field effect transistor is provided. FIG. 4A is a fragmentary plane view illustrative of a novel metal-semiconductor field effect transistor having an improved multi-layer structure inserted onto an interface between a compound semiconductor active layer and a silicon oxide passivation layer. FIG. 4B is a fragmentary cross sectional elevation view illustrative of a novel metal-semiconductor field effect transistor having an improved multi-layer structure inserted onto an interface between a compound semiconductor active layer and a silicon oxide passivation layer taken along an A–A' line of FIG. 4A. An n-GaAs active layer 2 is provided on a semi-insulating GaAs substrate 1. The n-GaAs active layer 2 has a recessed portion and ridged portions surrounding the recessed portion. Further, n-GaAs ohmic contact layers 3 are selectively formed on the ridged portions of the n-GaAs active layer 2. An epitaxial silicon layer 5 is provided which extends over the recessed portion of the n-GaAs active layer 2 and the n-GaAs ohmic contact layers 3. The epitaxial silicon layer 5 serves as surface control layer. An amorphous silicon layer 6 is further laminated on the epitaxial silicon layer 5. The amorphous silicon layer 6 serves as an oxidation buffer layer. A highly resistive silicon dioxide passivation layer 7 acting as passivation is provided over the amorphous silicon layer 6. Openings are provided to penetrate the laminations of the epitaxial silicon layer 5, the amorphous silicon layer 6 and the highly resistive silicon dioxide passivation layer 7 so that a gate electrode 9 of tungsten silicide and source and drain electrodes 10 and 11 of AuGeNi are provided in the openings.

The following descriptions will be concerned with fabrication processes for the above novel metal-semiconductor field effect transistor having the improved multi-layer structure inserted onto the interface between the compound semiconductor active layer and the silicon oxide passivation layer. FIGS. 5A through 5F are fragmentary cross sectional elevation views illustrative of novel metal-semiconductor field effect transistors having the improved multi-layer structure inserted onto the interface between the compound semiconductor active layer and the silicon oxide passivation layer in sequential steps involved in a novel fabrication method.

Figure 5A:
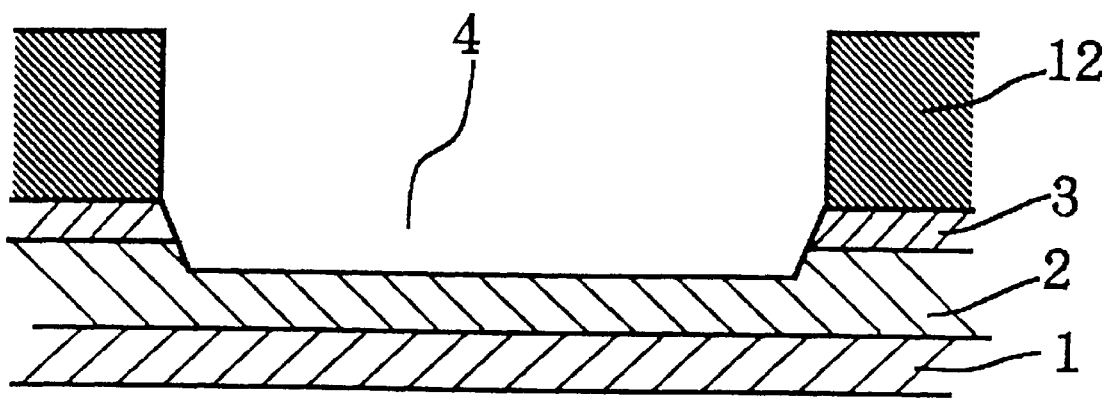
FIGS. 5A through 5F are fragmentary cross sectional elevation views illustrative of novel metal-semiconductor field effect transistors having the improved multi-layer structure inserted onto the interface between the compound semiconductor active layer and the silicon oxide passivation layer in sequential steps involved in a novel fabrication method in a first embodiment according to the present invention.

With reference to FIG. 5A, a semi-insulating GaAs substrate 1 is prepared. A n-GaAs active layer 2 is entirely formed on the semi-insulating GaAs substrate 1. An n-GaAs ohmic contact layer 3 is further entirely formed on the n-GaAs active layer 2. A photo-resist film is formed on the n-GaAs ohmic contact layer 3 for subsequent patterning the photo-resist film by a photo-lithography technique to form a photo-resist pattern 12. The n-GaAs ohmic contact layer 3 and the upper region of the n-GaAs active layer 2 are subjected to a selective etching by use of the photo-resist pattern 12 as mask to form a recessed portion 4. The used photo-resist pattern 12 is then removed.

Figure 5B:
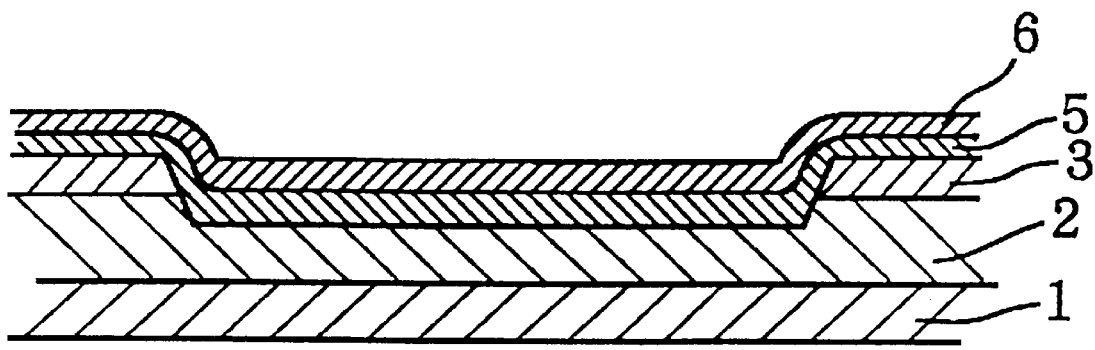

With reference to FIG. 5B, a wafer is introduced into a molecular beam epitaxy system. An epitaxial silicon layer 5 is epitaxially grown on the recessed portion 4 of the n-GaAs active layer 2 and on the n-GaAs ohmic contact layers 3 so that the epitaxial silicon layer 5 has a thickness of about 1 nanometer. It is allowable that the thickness of the epitaxial silicon layer 5 is not less than a thickness of mono-atomic layer. The maximum thickness of the epitaxial silicon layer 5 is limited to 1.5 nanometers in view of keeping the lattice match. The optimum thickness is about 1 nanometer. During the epitaxial growth of the epitaxial silicon layer 5, a substrate temperature is maintained at 250° C. However, the substrate temperature may be controlled in the range of 250° C. to 450° C. A temperature of a silicon molecular beam source is maintained at 1300° C. The thickness of the epitaxial silicon layer 5 is monitored by a reflective high energy electron beam diffraction method. If the thickness of the epitaxial silicon layer 5 becomes 1 nanometer, then growth conditions such as the substrate temperature are changed to drop the substrate temperature down to 200° C. for changing the silicon epitaxial growth into the amorphous growth thereby to form an amorphous silicon layer 6 on the epitaxial silicon layer 5. A thickness of the amorphous silicon layer 6 is 10 nanometers. The optimum thickness of the amorphous silicon layer 6 is variable for the kinds of the highly resistive layer and the growth conditions. If the highly resistive layer is silicon dioxide layer, then the preferable thickness of the amorphous silicon layer 6 is in the range of 1–10 nanometers. There is no problem if the thickness of the amorphous silicon layer 6 is thicker than 10 nanometers. If, however, the thickness of the amorphous silicon layer 6 is thinner than 1 nanometer, then there is a possibility that the epitaxial silicon layer 5 is oxidized in the process for forming the silicon dioxide passivation layer and also that the epitaxial silicon layer 5 is oxidized by residual oxygen in the CVD chamber.

Figure 5C:
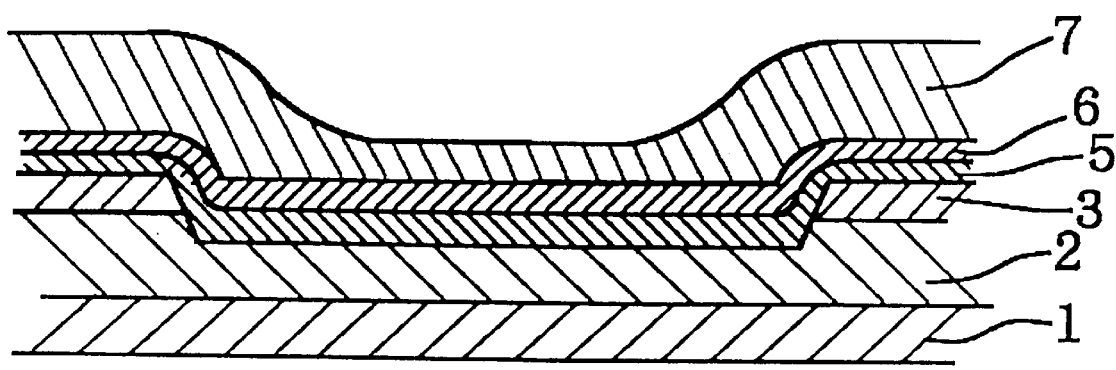

With reference to FIG. 5C, the wafer is picked up from the growth chamber for subsequent thermal chemical vapor deposition by use of mix gases of monosilane and oxygen to entirely form a highly resistive silicon dioxide passivation layer 7 having a thickness of 300 nanometers. The preferable thickness of the highly resistive silicon dioxide passivation layer 7 is in the range of 100 nanometers to 400 nanometers for allowing later formations of openings free of variations in diameters and sizes and accurately defining a gate length. In the above thermal chemical vapor deposition process, a surface region of the amorphous silicon layer 6 is oxidized by oxygen as source gas for chemical vapor deposition. Notwithstanding, a possible depth of immersion of oxygen into the amorphous silicon layer 6 is only 10 nanometers, for which reason the epitaxial silicon layer 5 is free from oxidation.

Figure 5D:
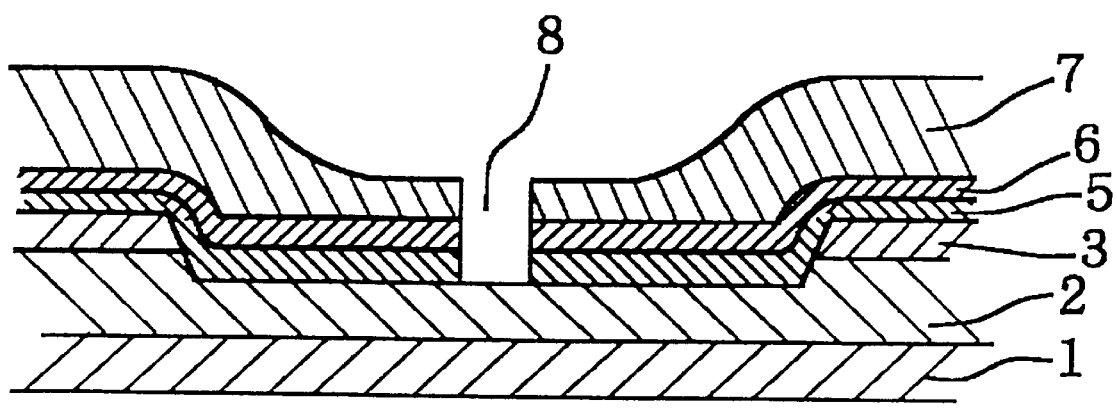

With reference to FIG. 5D, a photo-resist film is provided on the highly resistive silicon dioxide passivation layer 7 for subsequent patterning thereof by a photo-lithography technique to form a photo-resist pattern. The highly resistive silicon dioxide passivation layer 7, the amorphous silicon layer 6 and the epitaxial silicon layer 5 are subjected to a selective etching by use of the photo-resist pattern as mask thereby to form an opening 8. The used photo-resist pattern is then removed.

Figure 5E:
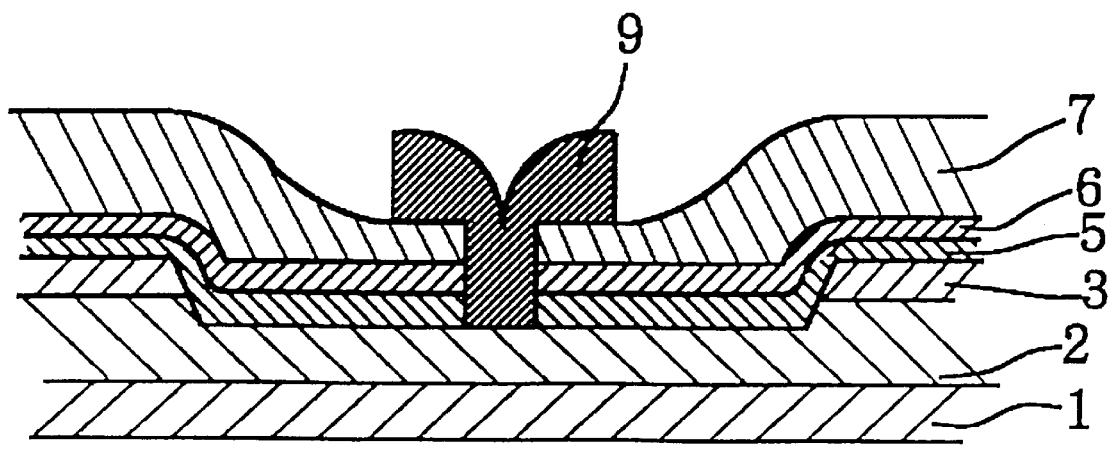

With reference to FIG. 5E, a metal layer is entirely deposited by a sputtering method so that the metal layer extends over the highly resistive silicon dioxide passivation layer 7 and within the opening 8. A photo-resist film is provided on the metal layer for subsequent patterning thereof by a photo-lithography technique to form a photo-resist pattern. The metal layer is subjected to a selective etching by use of the photo-resist pattern as mask thereby to form a gate electrode 9. The used photo-resist pattern is then removed.

Figure 5F:
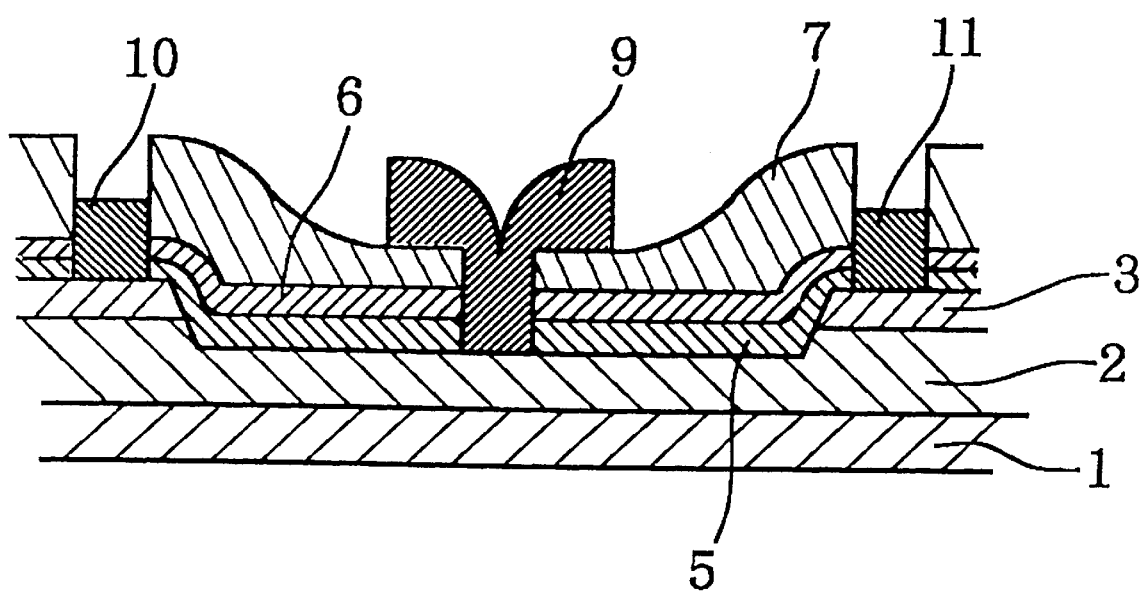

With reference to FIG. 5F, a photo-resist film is provided on the highly resistive silicon dioxide passivation layer 7 for subsequent patterning thereof by a photo-lithography technique to form a photo-resist pattern. The highly resistive silicon dioxide passivation layer 7, the amorphous silicon layer 6 and the epilaxial silicon layer are subjected to a selective etching by use of the photo-resist pattern as mask thereby to form opening over the n-GaAs ohmic contact layers 3. Source and drain electrode 10 and 11 made of AuGeNi are formed in the openings by lift-off method.

The required GaAs metal semiconductor field effect transistor having the reduced surface state density can be formed by more simple processes than the conventional ones.

It was confirmed that the frequency dispersion of the drain electrode 11 due to the charge traps are completely suppressed. If the novel and conventional transistors were operated for not less than 10000 hours at room temperature, then the conventional transistor shows increase in the gate lag whilst the novel transistor show no change in performances and exhibits stable high frequency performances.

The above novel structure and fabrication processes described above are applicable to high electron mobility transistors, hetoro-structure field effect transistors, insulating gate field effect transistors and other field effect transistors.

The above novel structure and fabrication processes described above are also applicable to when GaAs compound semiconductor is replaced by other compound semiconductors such as InGaAs.

SECOND EMBODIMENT

Figure 6A:
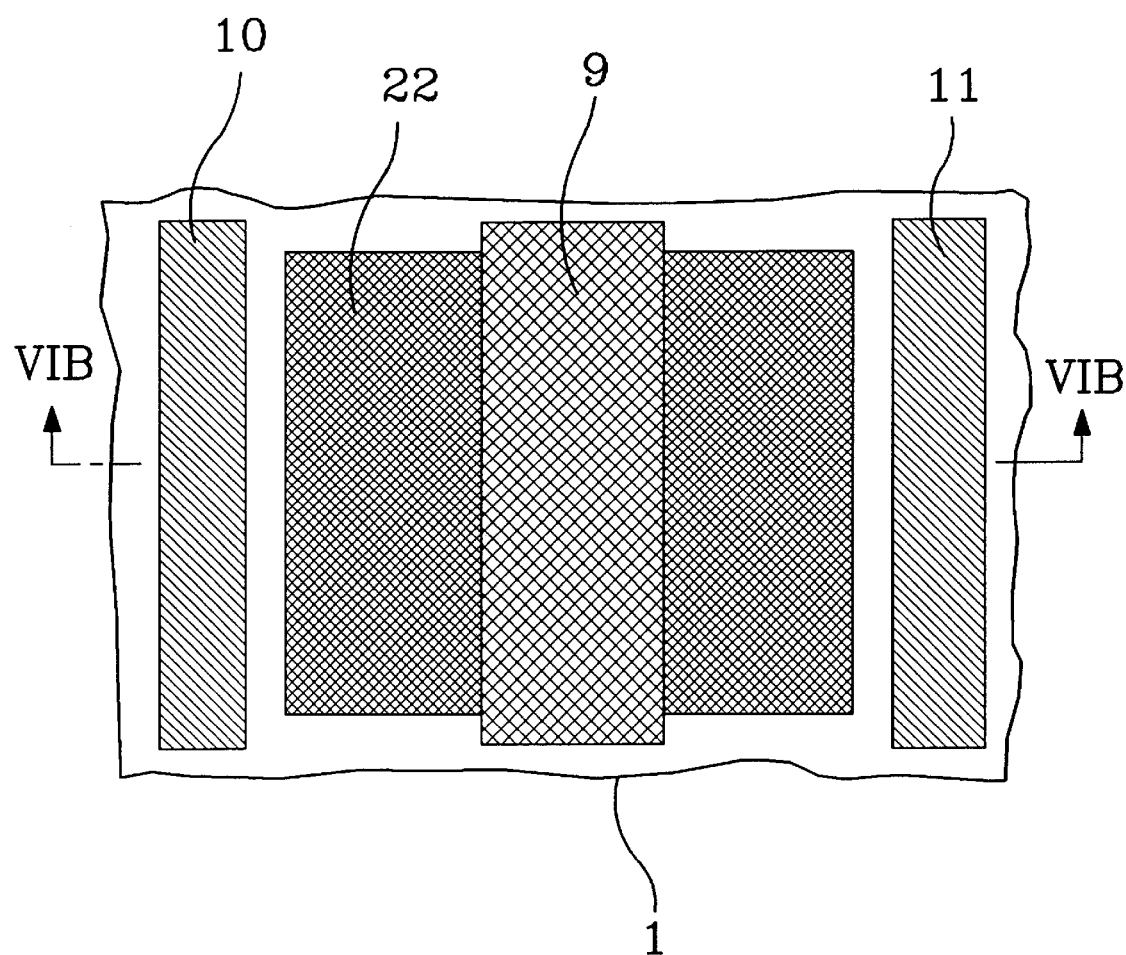
FIG. 6A is a fragmentary plane view illustrative of a novel metal-semiconductor field effect transistor having an improved multi-layer structure inserted onto an interface between a compound semiconductor active layer and a silicon nitride passivation layer in a second embodiment according to the present invention.
Figure 6B:
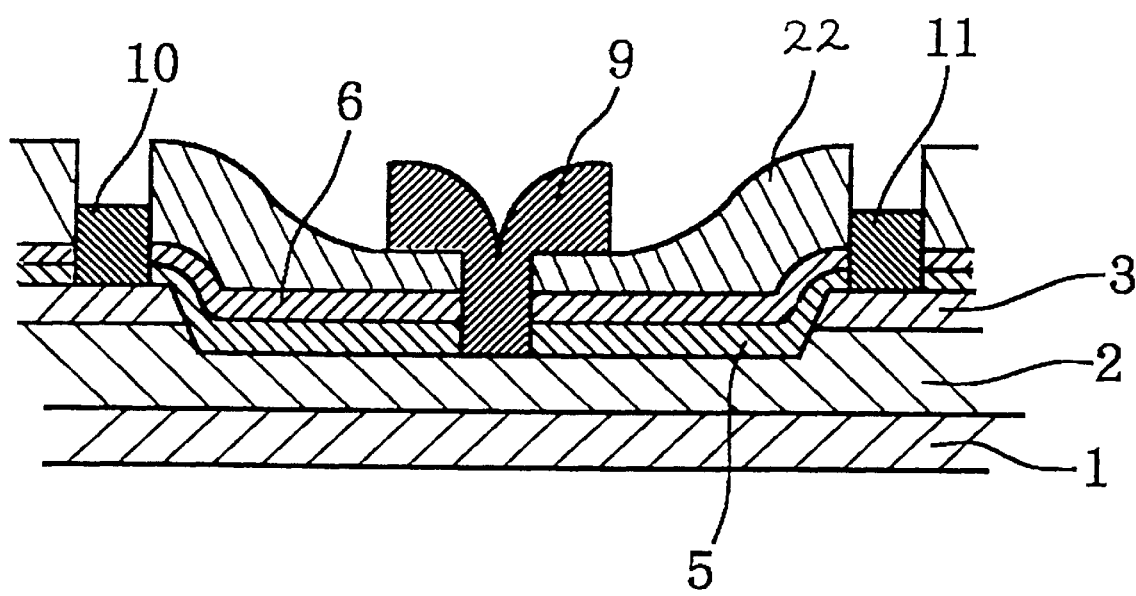
FIG. 6B is a fragmentary cross sectional elevation view illustrative of a novel metal-semiconductor field effect transistor having an improved multi-layer structure inserted onto an interface between a compound semiconductor active layer and a silicon nitride passivation layer taken along an A–A' line of FIG. 6A in a second embodiment according to the present invention.

A second embodiment according to the present invention will be described in detail with reference to FIGS. 6A and 6B, wherein a novel metal-semiconductor field effect transistor is provided. FIG. 6A is a fragmentary plane view illustrative of a novel metal-semiconductor field effect transistor having an improved multi-layer structure inserted onto an interface between a compound semiconductor active layer and a silicon nitride passivation layer. FIG. 6B is a fragmentary cross sectional elevation view illustrative of a novel metal-semiconductor field effect transistor having an improved multi-layer structure inserted onto an interface between a compound semiconductor active layer and a silicon nitride passivation layer taken along an A–A' line of FIG. 6A. An n-GaAs active layer 2 is provided or, a semi-insulating GaAs substrate 1. The n-GaAs active layer 2 has a recessed portion and ridged portions surrounding the recessed portion. Further, n-GaAs ohmic contact layers 3 are selectively formed on the ridged portions of the n-GaAs active layer 2. An epitaxial silicon layer 5 is provided which extends over the recessed portion of the n-GaAs active layer 2 and the n-GaAs ohmic contact layers 3. The epitaxial silicon layer 5 serves as surface control layer. An amorphous silicon layer 6 is further laminated on the epitaxial silicon layer 5. The amorphous silicon layer 6 serves as an oxidation buffer layer. A highly resistive silicon nitride passivation layer 22 acting as passivation is provided over the amorphous silicon layer 6. Openings are provided to penetrate the laminations of the epitaxial silicon layer 5, the amorphous silicon layer 6 and the highly resistive silicon nitride passivation layer 22 so that a gate electrode 9 of tungsten silicide and source and drain electrodes 10 and 11 of AuGeNi are provided in the openings.

The following descriptions will be concerned with fabrication processes for the above novel metal-semiconductor field effect transistor having the improved multi-layer structure inserted onto the interface between the compound semiconductor active layer and the silicon nitride passivation layer. FIGS. 7A through 7H are fragmentary cross sectional elevation views illustrative of novel metal-semiconductor field effect transistors having the improved multi-layer structure inserted onto the interface between the compound semiconductor active layer and the silicon nitride passivation layer in sequential steps involved in a novel fabrication method.

Figure 7A:
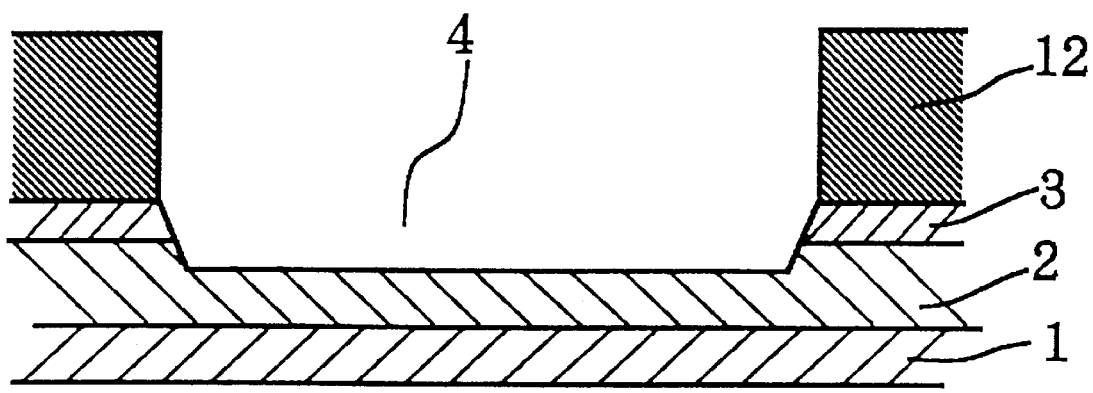
FIGS. 7A through 7H are fragmentary cross sectional elevation views illustrative of novel metal-semiconductor field effect transistors having the improved multi-layer structure inserted onto the interface between the compound semiconductor active layer and the silicon nitride passivation layer in sequential steps involved in a novel fabrication method in a second embodiment according to the present invention.

With reference to FIG. 7A, a semi-insulating GaAs substrate 1 is prepared. A n-GaAs active layer 2 is entirely formed on the semi-insulating GaAs substrate 1. An n-GaAs ohmic contact layer 3 is further entirely formed on the n-GaAs active layer 2. A photo-resist film is formed on the n-GaAs ohmic contact layer 3 for subsequent patterning the photo-resist film by a photo-lithography technique to form a photo-resist pattern 12. The n-GaAs ohmic contact layer 3 and the upper region of the n-GaAs active layer 2 are subjected to a selective etching by use of the photo-resist pattern 12 as mask to form a recessed portion 4. The used photo-resist pattern 12 is then removed.

Figure 7B:
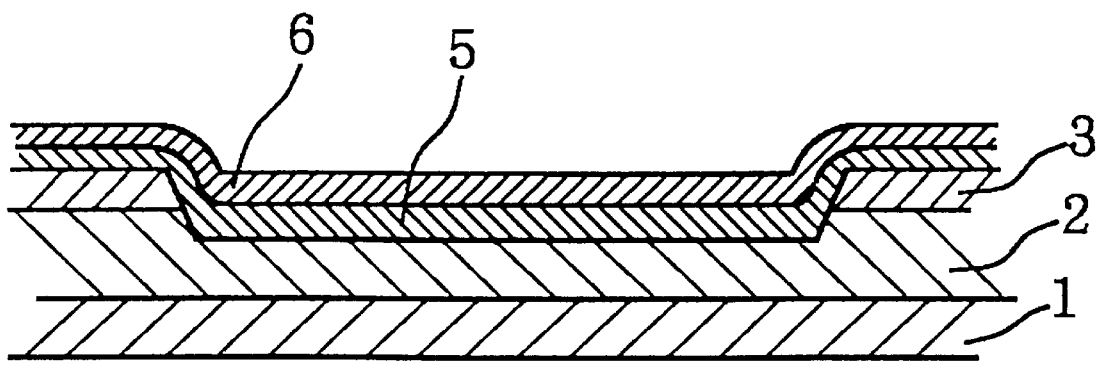

With reference to FIG. 7B, a wafer is introduced into a molecular beam epitaxy system. An epitaxial silicon layer 5 is epitaxially grown on the recessed portion 4 of the n-GaAs active layer 2 and on the n-GaAs ohmic contact layers 3 so that the epitaxial silicon layer 5 has a thickness of about 1 nanometer. It is allowable that the thickness of the epitaxial silicon layer 5 is not less than a thickness of mono-atoinic layer. The maximum thickness of the epitaxial silicon layer 5 is limited to 1.5 nanometers in view of keeping the lattice match. The optimum thickness is about 1 nanometer. During the epitaxial growth of the epitaxial silicon layer 5, a substrate temperature is maintained at 250° C. However, the substrate temperature may be controlled in the range of 250° C. to 450° C. A temperature of a silicon molecular beam source is maintained at 1300° C. The thickness of the epitaxial silicon layer 5 is monitored by a reflective high energy electron beam diffraction method. If the thickness of the epitaxial silicon layer 5 becomes 1 nanometer, then growth conditions such as the substrate temperature are changed to drop the substrate temperature down to 200° C. for changing the silicon epitaxial growth into the amorphous growth thereby to form an amorphous silicon layer 6 on the epitaxial silicon layer 5. A thickness of the amorphous silicon layer 6 is 1 nanometer. The optimum thickness of the amorphous silicon layer 6 is variable for the kinds of the highly resistive layer and the growth conditions.

Figure 7C:
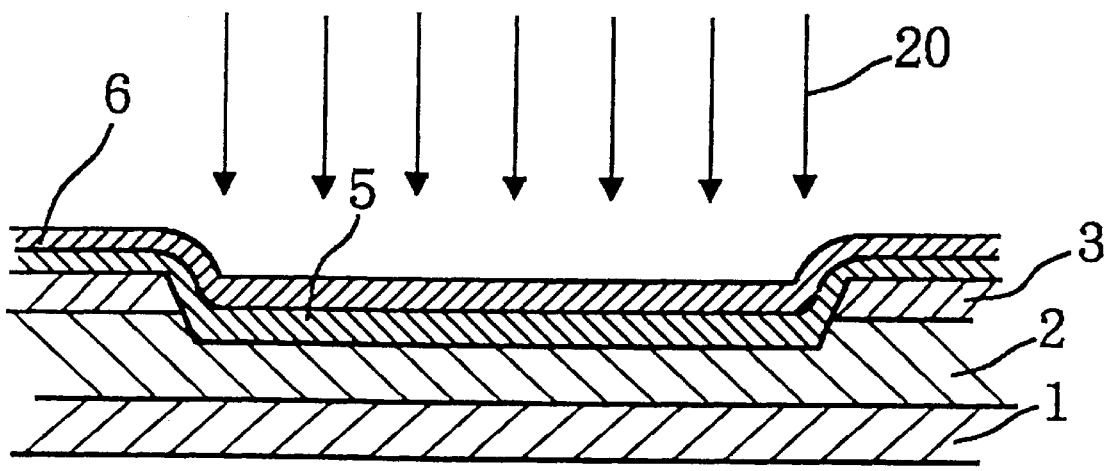

With reference to FIG. 7C, the wafer is picked up from the growth chamber for subsequent exposure of the surface of the amorphous silicon layer 6 to $NH_3$ gas flow 20 at a flow rate of 10–500 sccm, during which the wafer is distanced by 4 cm from the catalyst. The available distance between the wafer and the catalyst is in the range of 3–5 cm. If the wafer becomes more close to the catalyst, the wafer surface temperature is increased by the radiation heat from the catalyst. If the wafer becomes far from the catalyst, then the cleaning rate is dropped.

In the cleaning process, the substrate temperature is maintained at 300° C. and the catalyst temperature is maintained at 1300° C. The available substrate temperature is in the range of 300° C. to 450° C. If the substrate temperature is higher than the above available range, then a reaction is caused on an interface between the GaAs substrate 1 and the epitaxial silicon layer 5 thereby causing a bond disordering, resulting in increase in the surface state density. The available catalyst temperature is in the range of 1300° C. to 1500° C. For activation of hydrogen, tungsten is used as catalyst, although plasma, photo-excitation and catalytic cracking reaction are also available.

Figure 7D:
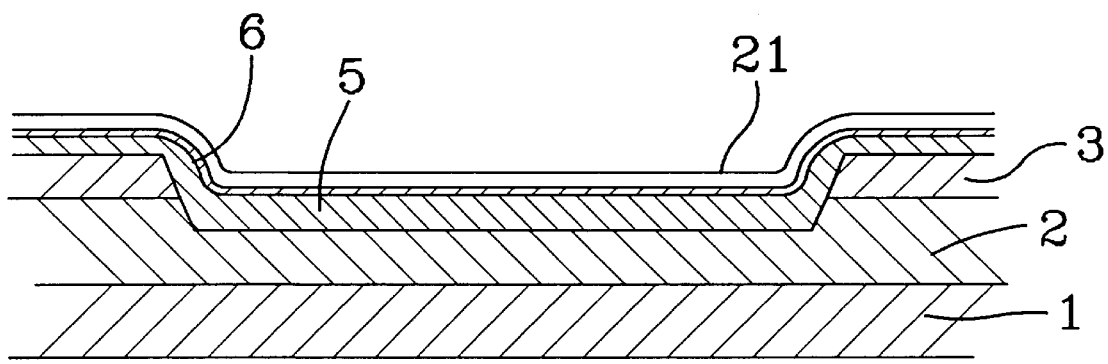

With reference to FIG. 7D, the above cleaning process by use of $NH_3$ gas may preferable be continued for about 5 minutes to remove carbon having been adhered on the amorphous silicon layer 6 and impurities such as ions. Further, the spontaneous silicon oxide film having been formed during movement to the chemical vapor deposition chamber is also removed before the surface of the amorphous silicon layer 6 is nitrated by the $NH_3$ gas thereby to form a thin silicon nitride film 21 on the amorphous silicon layer 6.

Figure 7E:
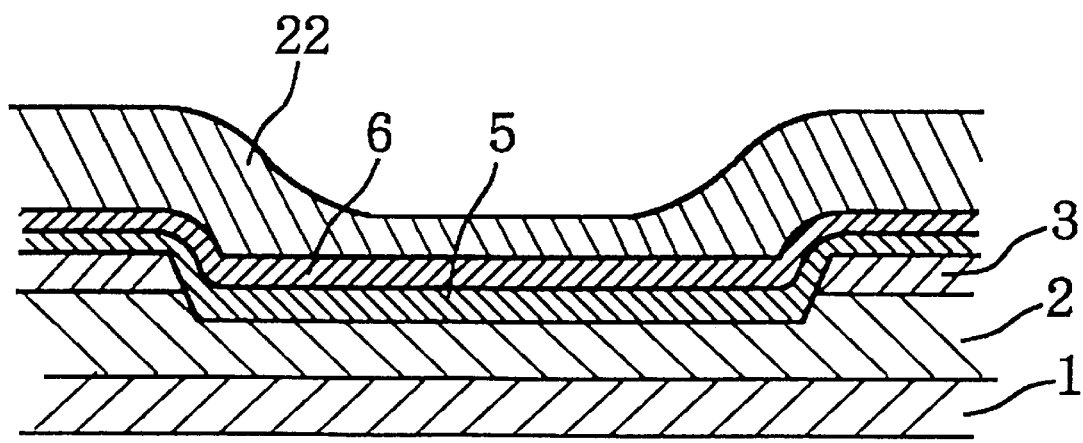

With reference to FIG. 7E, the wafer is placed for 5 minutes before $SiH_4$ gas flow at 1 sccm is added to the $NH_3$ gas flow of the unchanged flow rate for initiation of deposition of a silicon nitride film 22 onto the thin silicon nitride film 21 in the same chamber for complete prevention of oxidation of the amorphous silicon layer 6 after the cleaning process and before the process for deposition of the silicon nitride layer 22. During the deposition process, the substrate temperature, the catalyst temperature and the distance of the wafer from the catalyst remain unchanged from those in the above cleaning process. As a result, the highly resistive silicon nitride passivation layer 22 having the thickness of 300 nanometers is deposited on the amorphous silicon layer 6.

Figure 7F:
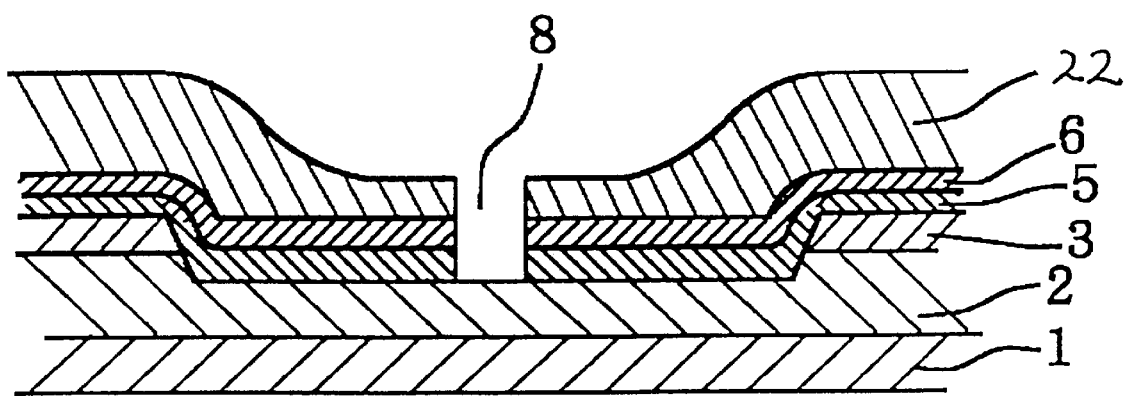

With reference to FIG. 7F, a photo-resist film is provided on the highly resistive silicon nitride passivation layer 22 for subsequent patterning thereof by a photo-lithography technique to form a photo-resist pattern. The highly resistive silicon nitride passivation layer 22, the amorphous silicon layer 6 and the epitaxial silicon layer 5 are subjected to a selective etching by use of the photo-resist pattern as mask thereby to form an opening 8. The used photo-resist pattern is then removed.

Figure 7G:
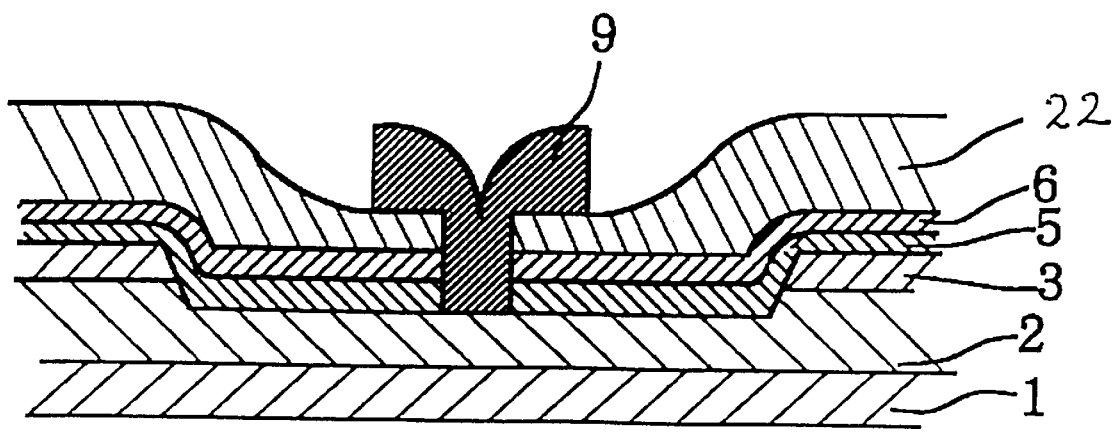

With reference to FIG. 7G, a metal layer is entirely deposited by a sputtering method so that the metal layer extends over the highly resistive silicon nitride passivation layer 22 and within the opening 8. A photo-resist film is provided on the metal layer for subsequent patterning thereof by a photo-lithography technique to form a photo-resist pattern. The metal layer is subjected to a selective etching by use of the photo-resist pattern as mask thereby to form a gate electrode 9. The used photo-resist pattern is then removed.

Figure 7H:
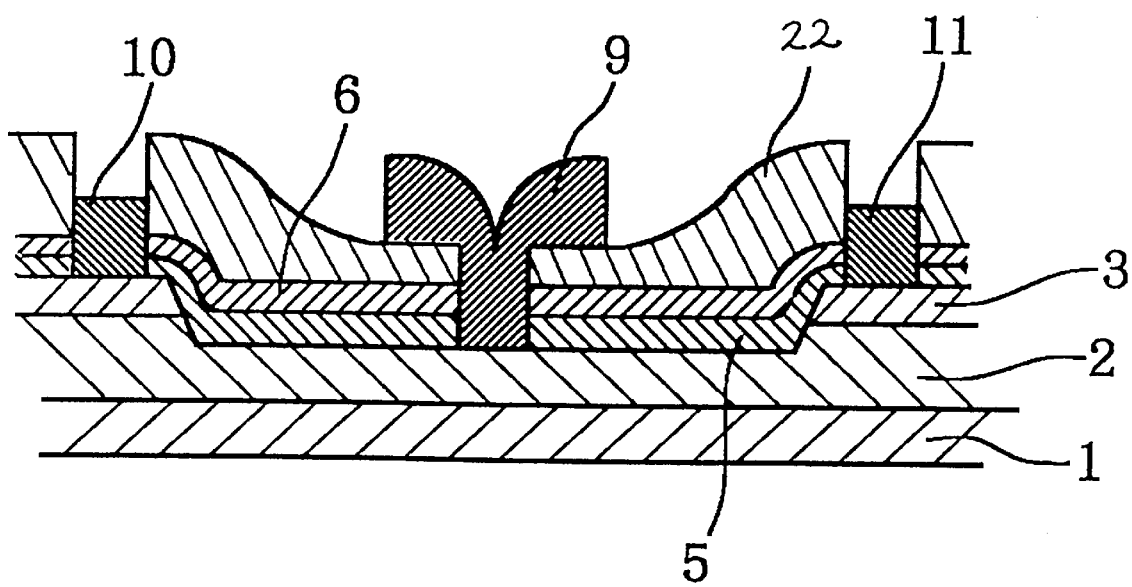

With reference to FIG. 7H, a photo-resist film is provided on the highly resistive silicon nitride passivation layer 22 for subsequent patterning thereof by a photo-lithography technique to form a photo-resist pattern. The highly resistive silicon nitride passivation layer 22, the amorphous silicon layer 6 and the epitaxial silicon layer 5 are subjected to a selective etching by use of the photo-resist pattern as mask thereby to form opening over the n-GaAs ohmic contact layers 3. Source and drain electrode 10 and 11 made of AuGeNi are formed in the openings by lift-off method.

The required GaAs metal semiconductor field effect transistor having the reduced surface state density can be formed by more simple processes than the conventional ones.

In this second embodiment, the amorphous silicon layer 6 is free from oxidation during the process for deposition of the highly resistive silicon nitride passivation layer 22. The thickness of not less than 1 nanometer of the amorphous silicon layer 6 is sufficient.

Further, the above cleaning process can remove the spontaneous silicon oxide film from the surface of the amorphous silicon layer 6 and also remove various impurities therefrom.

Furthermore, the use of $NH_3$ gas causes not only those removals but also nitration of the surface of the amorphous silicon layer 6. The interface between the amorphous silicon layer 6 and the highly resistive silicon nitride passivation layer 22 is perfectly cleaned. For which reason the transistor is free from the problem with the gate lag.

In pace of $NH_3$ gas, mixture gases of nitrogen and hydrogen activated by plasma, photo-excitation, catalytic cracking reaction are also available. Further, a compound such as hydrazine is also as available.

The above novel structure and fabrication processes described above are applicable to high electron mobility transistors, hetoro-structure field effect transistors, insulating gate field effect transistors and other field effect transistors.

The above novel structure and fabrication processes described above are also applicable to when GaAs compound semiconductor is replaced by other compound semiconductors such as InGaAs.

THIRD EMBODIMENT

A third embodiment according to the present invention will be described in detail with reference to FIGS. 8A through 8C which are fragmentary cross sectional elevation views illustrative of a semiconductor device integrated with a high frequency metal-semiconductor field effect transistor having a reduced surface state density and a high voltage metal-semiconductor field effect transistor in sequential steps involved in a novel fabrication method.

Figure 8A:
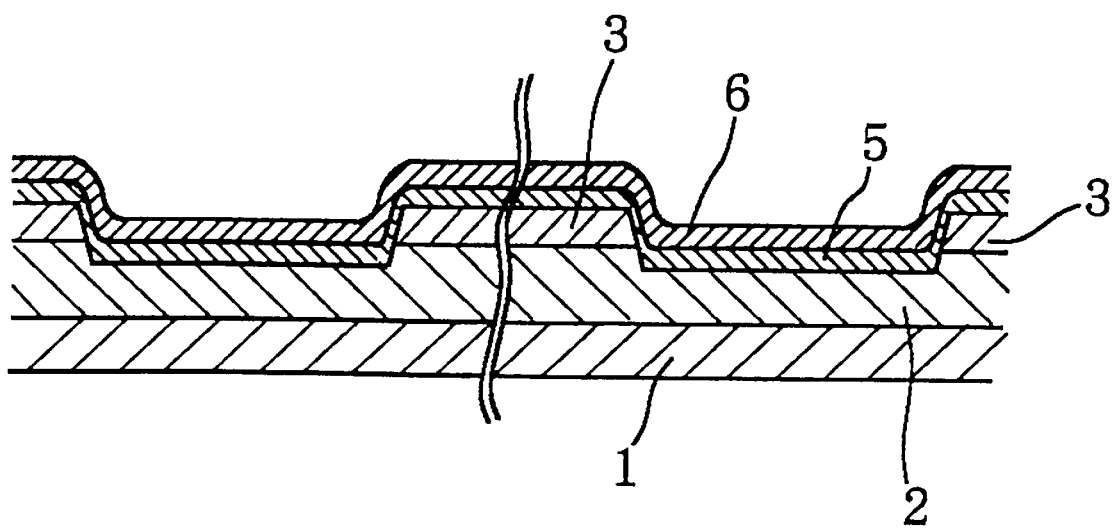
FIGS. 8A through 8C are fragmentary cross sectional elevation views illustrative of a semiconductor device integrated with a high frequency metal-semiconductor field effect transistor having a reduced surface state density and a high voltage metal-semiconductor field effect transistor in sequential steps involved in a novel fabrication method in a third embodiment according to the present invention.

With reference to FIG. 8A, a semi-insulating GaAs substrate 1 is prepared. A n-GaAs active layer 2 is entirely formed on the semi-insulating GaAs substrate 1. An n-GaAs ohmic contact layer 3 is further entirely formed on the n-GaAs active layer 2. A photo-resist film is formed on the n-GaAs ohmic contact layer 3 for subsequent patterning the photo-resist film by a photo-lithography technique to form a photo-resist pattern. The n-GaAs ohmic contact layer 3 and the upper region of the n-GaAs active layer 2 are subjected to a selective etching by use of the photo-resist pattern as mask to form first and second recessed portions. The used photo-resist pattern is then removed. Subsequently, a wafer is introduced into a molecular beam epitaxy system. An epitaxial silicon layer 5 is epitaxially grown on the recessed portions 4 of the n-GaAs active layer 2 and on the n-GaAs ohmic contact layers 3 so that the epitaxial silicon layer 5 has a thickness of about 1 nanometer. It is allowable that the thickness of the epitaxial silicon layer 5 is not less than a thickness of mono-atomic layer. The maximum thickness of the epitaxial silicon layer 5 is limited to 1.5 nanometers in view of keeping the lattice match. The optimum thickness is about 1 nanometer. During the epitaxial growth of the epitaxial silicon layer 5, a substrate temperature is maintained at 250° C. However, the substrate temperature may be controlled in the range of 250° C. to 450° C. A temperature of a silicon molecular beam source is maintained at 1300° C. The thickness of the epitaxial silicon layer 5 is monitored by a reflective high energy electron beam diffraction method. If the thickness of the epitaxial silicon layer 5 becomes 1 nanometer, then growth conditions such as the substrate temperature are changed to drop the substrate temperature down to 200° C. for changing the silicon epitaxial growth into the amorphous growth thereby to form an amorphous silicon layer 6 on the epitaxial silicon layer 5. A thickness of the amorphous silicon layer 6 is 10 nanometers. The optimum thickness of the amorphous silicon layer 6 is variable for the kinds of the highly resistive layer and the growth conditions. If the highly resistive layer is silicon dioxide layer, then the preferable thickness of the amorphous silicon layer 6 is in the range of 1–10 nanometers. There is no problem if the thickness of the amorphous silicon layer 6 is thicker than 10 nanometers. If, however, the thickness of the amorphous silicon layer 6 is thinner than 1 nanometer, then there is a possibility that the epitaxial silicon layer 5 is oxidized in the process for forming the silicon dioxide passivation layer and also that the epitaxial silicon layer 5 is oxidized by residual oxygen in the CVD chamber.

Figure 8B:
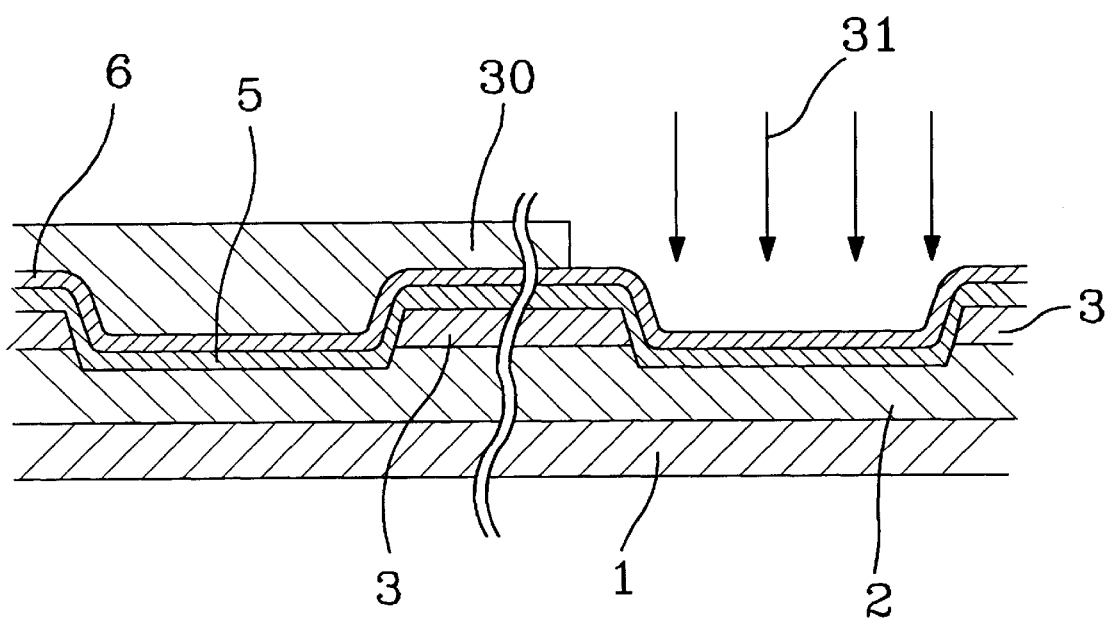

With reference to FIG. 8B, a photo-resist film is formed on the amorphous silicon layer 6 for subsequent patterning the photo-resist film by a photo-lithography technique to form a photo-resist pattern 30. A selective oxidation is carried out by use of the photo-resist pattern 30 as a mask wherein an oxygen plasma 31 containing activated oxygen is irradiated onto the amorphous silicon layer 6 whereby, the amorphous silicon layer 6, the epitaxial silicon layer 5 and an upper region of the n-GaAs active layer 3 are oxidized. For activation of oxygen, plasma, photo-excitation and catalyst are available. The flow rate of oxygen gas is 100 sccm. The substrate temperature is room temperature. The irradiation is continued for 10 minutes. The available oxygen gas flow rate is in the range of 100–500 sccm. The available substrate temperature is in the range of room temperature to 100° C. The available irradiation time is in the range of 5–30 minutes. If the substrate temperature is beyond the above available range, then the oxidation rate is increased, but an uniformity of the wafer is deteriorated. As the etching rate of the photo-resist mask is high, it is difficult to carry out the required selective oxidation on the wafer surface. The optimum thickness of the photo-resist mask depends upon oxidation time and the substrate temperature. If the substrate temperature is room temperature, then the thickness of about 1 micrometer the photo-resist mask is sufficient.

If the oxidation is progressed on the interface between the insulation layer and the compound semiconductor layer, then charge traps are formed which cause unstable phenomenons such as gate lag but capture electrons whereby the high voltage characteristic of the transistor is improved.

Figure 8C:
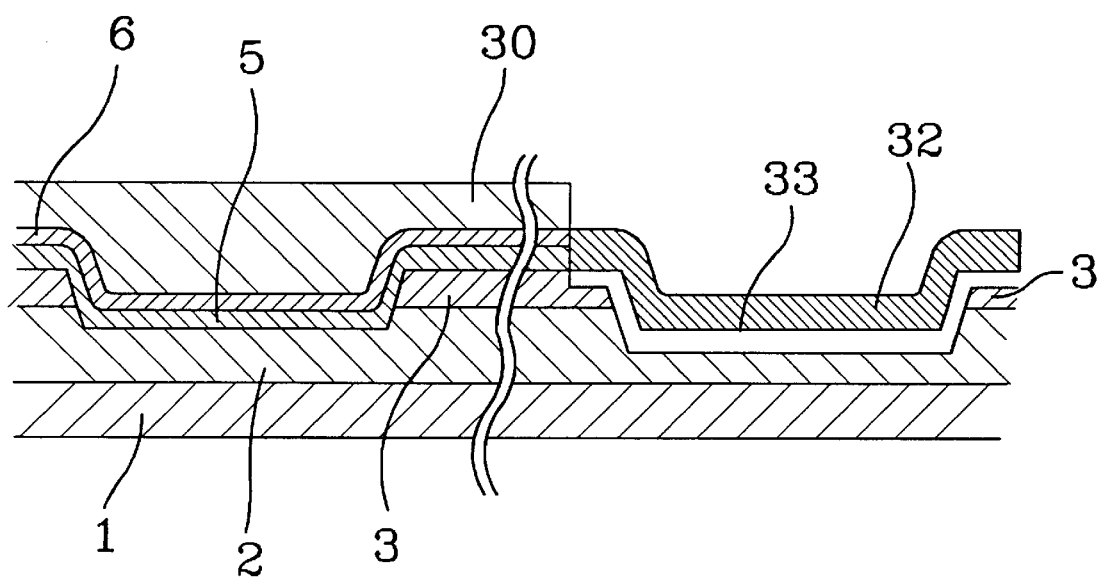

With reference to FIG. 8C, as a result of the above oxidation, a GaAs oxide layer 33 and a silicon oxide buffer layer 32 are selectively formed on the second active region. The used photo-resist mask 30 is removed. The wafer is picked up from the growth chamber for subsequent thermal chemical vapor deposition by use of mix gases of monosilane and oxygen to entirely form a highly resistive silicon dioxide passivation layer. The preferable thickness of the highly resistive silicon dioxide passivation layer 7 is in the range of 100 nanometers to 400 nanometers for allowing later formations of openings free of variations in diameters and sizes and accurately defining a gate length. In the above thermal chemical vapor deposition process, a surface region of the amorphous silicon layer 6 is oxidized by oxygen as source gas for chemical vapor deposition. Notwithstanding, a possible depth of immersion of oxygen into the amorphous silicon layer 6 is only 10 nanometers, for which reason the epitaxial silicon layer 5 is free from oxidation. A photo-resist film is provided on the highly resistive silicon dioxide passivation layer for subsequent patterning thereof by a photo-lithography technique to form a photo-resist pattern. The highly resistive silicon dioxide passivation layer, the amorphous silicon layer 6 and the epitaxial silicon layer 5 are subjected to a selective etching by use of the photo-resist pattern as mask thereby to form an opening. The used photo-resist pattern is then removed. A metal layer is entirely deposited by a sputtering method so that the metal layer extends over the highly resistive silicon dioxide passivation layer and within the opening. A photo-resist film is provided on the metal layer for subsequent patterning thereof by a photo-lithography technique to form a photo-resist pattern. The metal layer is subjected to a selective etching by use of the photo-resist pattern as mask thereby to form a gate electrode. The used photo-resist pattern is then removed. A photo-resist film is provided on the highly resistive silicon dioxide passivation layer for subsequent patterning thereof by a photo-lithography technique to form a photo-resist pattern. The highly resistive silicon dioxide passivation layer, the amorphous silicon layer 6 and the epitaxial silicon layer 5 are subjected to a selective etching by use of the photo-resist pattern as mask thereby to form opening over the n-GaAs ohmic contact layers 3. Source and drain electrode made of AuGeNi are formed in the openings by lift-off method.

The semiconductor device integrated with the high frequency metal-semiconductor field effect transistor having the reduced surface state density and the high voltage metal-semiconductor field effect transistor is formed on the GaAs substrate.

FOURTH EMBODIMENT

Figure 9:
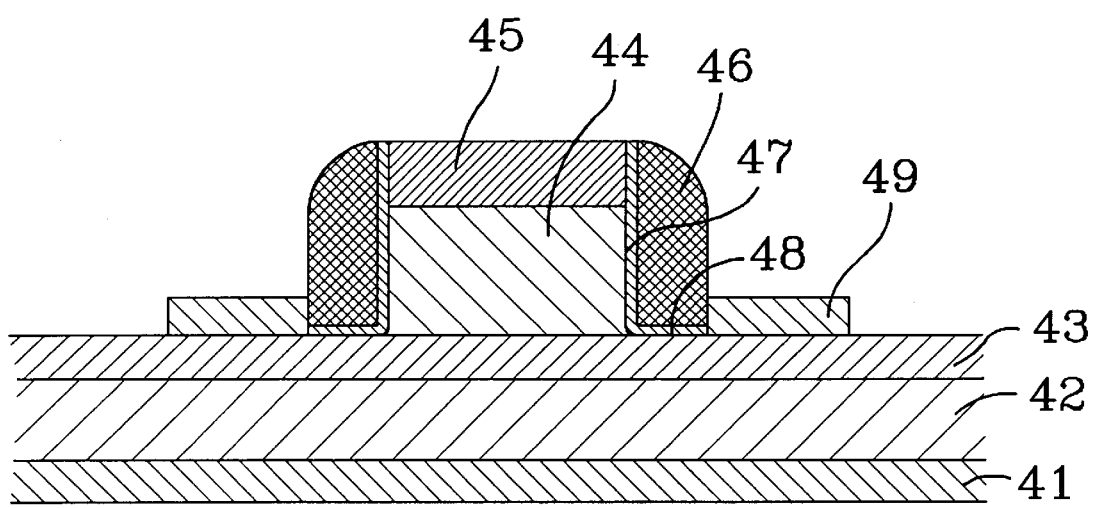
FIG. 9 is a fragmentary cross sectional elevation view illustrative of a novel hetero-junction bipolar transistor having a reduced surface state density in a fourth embodiment according to the present invention.
Figure 10A:
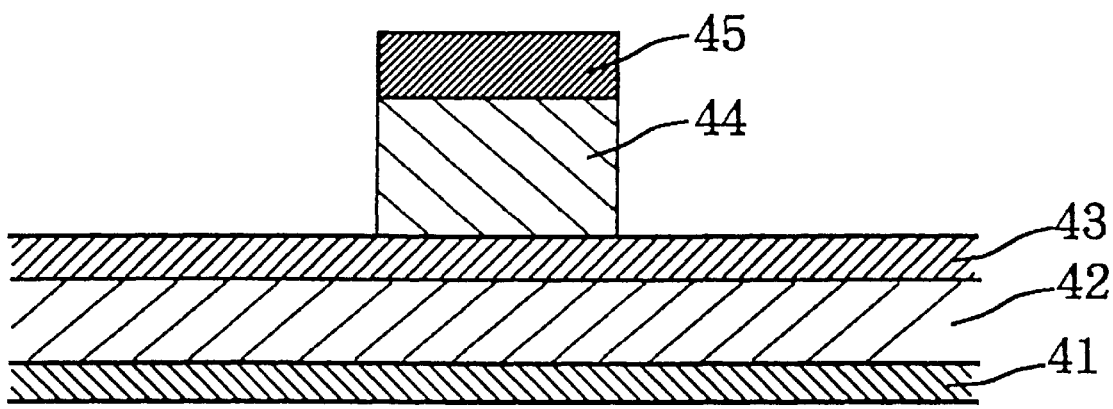
FIGS. 10A through 10C are fragmentary cross sectional elevation views illustrative of novel hetero-junction bipolar transistors in sequential steps involved in a novel fabrication method in a fourth embodiment according to the present invention.
Figure 10B:
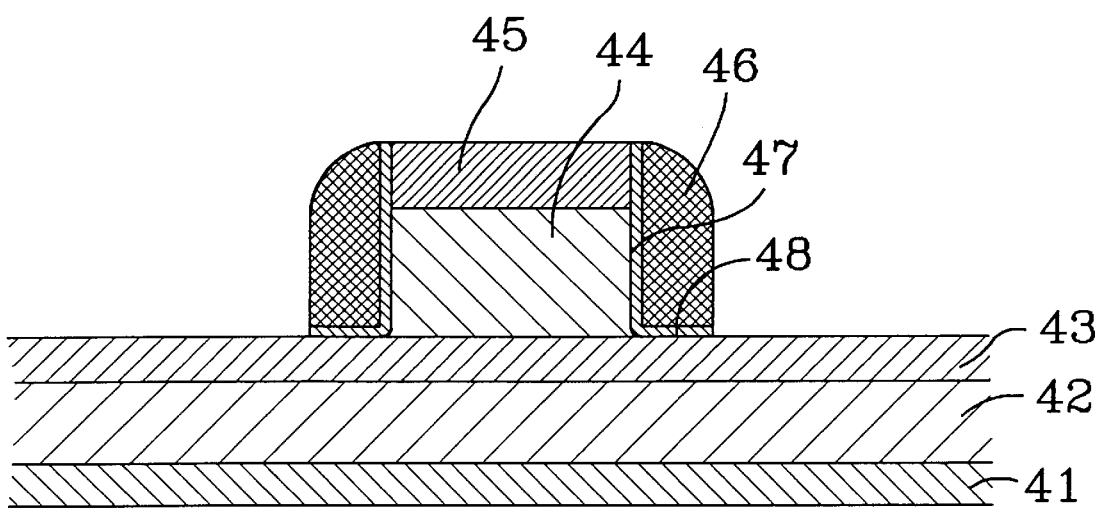
Figure 10C:
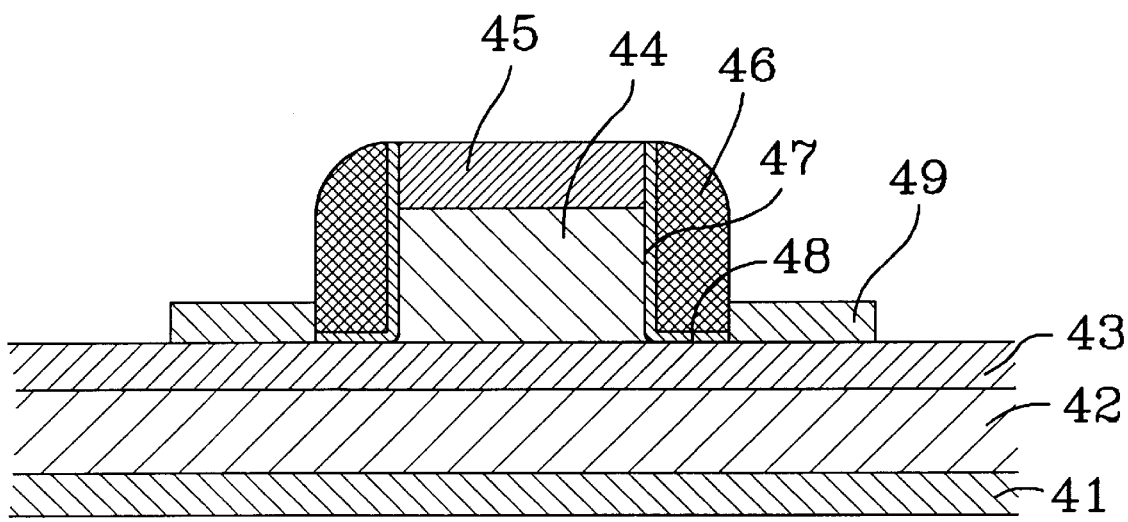

A fourth embodiment according to the present invention will be described in detail with reference to FIGS. 9 and 10A through 10C. FIG. 9 is a fragmentary cross sectional elevation view illustrative of a novel hetero-junction bipolar transistor having a reduced surface state density. FIGS. 10A through 10C are fragmentary cross sectional elevation views illustrative of novel hetero-junction bipolar transistors in sequential steps involved in a novel fabrication method.

The novel heterojunction bipolar transistor leaving a reduced surface state density is formed on a semi-insulating GaAs substrate 41. An n-GaAs collector layer 42 is provided on the semi-insulating GaAs substrate 41. A p-GaAs base layer 43 is provided on the n-GaAs collector layer 42. An n-AlGaAs emitter layer 44 is selectively provided on the p-GaAs base layer 43. A tungsten silicide emitter electrode 45 is provided on the n-AlGaAs emitter layer 44. Epitaxial silicon layers 48 are provided which extend on opposite side walls of the tungsten silicide emitter electrode 45 and also on opposite side walls of the n-AlGaAs emitter layer 44 as well as extend over parts of the p-GaAs base layer 43 in the vicinity of the n-AlGaAs emitter layer 44. The epitaxial silicon layers 48 serve as the surface control layer. Amorphous silicon layers 17 are laminated on the epitaxial silicon layers 48. Side wall silicon dioxide layers 46 are provided on the amorphous silicon layers 47. Further, AuMn base electrodes 49 are provided on the selected parts of the p-GaAs base layer 43 around the side wall silicon dioxide layers 46. An AuGeNi collector electrode not shown is selectively provided within an opening of the p-GaAs base layer 43 and on the n-GaAs collector layer 42.

The following descriptions will focus on the fabrication processes for the above hetero-junction bipolar transistor with reference to FIGS. 10A through 10C.

With reference to FIG. 10A, an n-GaAs collector layer 42 is formed on a semi-insulating GaAs substrate 41. A p-GaAs base layer 43 is formed on the n-GaAs collector layer 42. An n-AlGaAs cemitter layer 44 is formed on the p-GaAs base layer 43. A tungsten silicide layer having a thickness of about 250 nanometers is formed on the n-AlGaAs emitter layer 44. A photo-resist film is provided on the tungsten silicide layer for subsequent patterning by a photolithography technique to form a photo-resist pattern on the tungsten silicide layer. A dry etching is carried out by use of the photo-resist pattern as a mask to selectively etch the laminations of the n-AlGaAs emitter layer 44 and the tungsten silicide layer whereby the n-AlGaAs emitter layer 44 is defined and the tungsten silicide emitter electrode 45 is formed on the n-AlGaAs emitter layer 44.

With reference to FIG. 10B, in the same manners as in the first embodiment, an epitaxial silicon layer 48 having a thickness of 1 nanometer is entirely formed to cover the top and side walls of the tungsten silicide emitter electrode 45 and on side walls of the n-AlGaAs emitter layer 44 as well as extends over the p-GaAs base layer 43. Subsequently, in the same manners as in the first embodiment, an amorphous silicon layer 47 having a thickness of 10 nanometers is entirely grown on the epitaxial silicon layer 48. Further, in the same manners as in the first embodiment, a silicon dioxide layer 46 having a thickness of 300 nanometers is entirely deposited on the amorphous silicon layer 47. The laminations of the epitaxial silicon layer 48, the amorphous silicon layer 47 and the silicon dioxide layer 46 are subjected to a reactive dry etching by use of $CF_4$ gas thereby to form side walls on the opposite side walls of the n-AlGaAs emitter layer 44 and the tungsten silicide emitter electrode 45, wherein each of the side walls comprises the epitaxial silicon layers 48, the amorphous silicon layers 47 laminated on the epitaxial silicon layers 48 and the side wall silicon dioxide layers 46 laminated on the amorphous silicon layers 47. The side walls have a thickness of about 200 nanometers.

The thickness of the side walls depends upon the total thickness of the laminations of the epitaxial silicon layer 48, the amorphous silicon layer 47 and the silicon dioxide layer 46. The thickness of not less than 50 nanometers of the side wall can prevent short circuit between the tungsten silicide emitter electrode 45 and the base electrode 49. A preferable thickness of the side walls is about 200 nanometers. The thickness of the laminations of the epitaxial silicon layer 48, the amorphous silicon layer 47 and the silicon dioxide layer 46 is decided in consideration of step-coverage of the silicon dioxide layer 46 and the degree of anisotropy for the reactive dry etching. If the reactive ion etching is carried out by use of $CF_4$ gas, then the thickness of the silicon dioxide layer 46 is preferable about 300 nanometers to obtain the side walls of 200 nanometers in thickness.

With reference to FIG. 10C, laminations of Ti, Pt and Au are deposited by an electron bean evaporation method for subsequent ion-milling to form the base electrodes 49.

In the $CF_4$ plasma etching process, silicon is not etched, for which reason unoxidized silicon layers, for example, the epitaxial silicon layers 48 and the amorphous silicon layers 47 remain over the p-GaAs base layer 43. The laminations epitaxial silicon layers 48 and the amorphous silicon layers 47 are selectively etched from the top surface of the p-GaAs base layer 43 as illustrated in FIG. 10C. Otherwise, optimization of the alloy condition for the base electrode is carried out to prevent the deteriorations of the characteristics of the bipolar transistor such as the increase in the base resistance.

In this fourth embodiment, in order to prevent formation of an emitter-base short circuit, the epitaxial silicon layers 48 is provided which extends not only on the side walls of the n-AlGaAs emitter layer 44 and the tungsten silicide emitter electrode 45 but also over the p-GaAs base layer 43, for which reason the epitaxial silicon layers 48 reduce the surface state density of the p-GaAs base layer 43. This reduction in surface state density of the p-GaAs base layer 43 results in a remarkable reduction in a surface recombination current whereby emitter side effects are well suppressed.

The above novel structure and fabrication processes are applicable to any other hetero-junction bipolar transistors such as InGaP/GaAs hetero-junction bipolar transistors and compositionally graded hetero-junction bipolar transistors.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A multi-layer structure inserted onto an interface between a compound semiconductor region and a highly resistive material region, said multi-layer structure comprising:

an epitaxial silicon layer no more than 1.5 nm thick and at least as thick as mono-atomic silicon that is in contact with said compound semiconductor region; and an amorphous silicon layer from 1 to 10 nm thick that is in contact with said highly resistive material region and laminated on said epitaxial silicon layer.

2. The multi-layer structure as claimed in claim 1, wherein said highly resistive material region comprises an insulation region.

3. The multi-layer structure as claimed in claim 2, wherein said insulation region is a silicon oxide region.

4. The multi-layer structure as claimed in claim 3, further comprising a silicon nitride layer provided between said amorphous silicon layer and said silicon oxide region.

5. The multi-layer structure as claimed in claim 2, wherein said insulation region is a silicon nitride region.

6. The multi-layer structure is claimed in claim 1, wherein said epitaxial silicon layer has a thickness of 1.0 nanometer.

7. The multi-layer structure as claimed in claim 1, wherein said amorphous silicon layer has a thickness of not less than 6 nm and no more than 10 nm.

8. The multi-layer structure is claimed in claim 1, wherein said compound semiconductor region comprises an active region provided on a compound semiconductor substrate.

9. The multi-layer structure as claimed in claim 1, wherein said compound semiconductor region comprises a first active region and a second active region, and wherein said multi-layer structure is provided on the first active region and a compound semiconductor oxide layer is provided on said second active region and a silicon oxide layer is laminated on the compound semiconductor oxide layer.

10. A multi-layer structure in a semiconductor device, comprising:

a compound semiconductor active layer being provided over a compound semiconductor substrate;

an epitaxial silicon layer no more than 1.5 nm thick and at least as thick as mono-atomic silicon that is on said compound semiconductor active layer;

an amorphous silicon layer from 1 to 10 nm thick that is laminated on said epitaxial silicon layer; and a highly resistive material layer on said amorphous silicon layer.

11. The multi-layer structure as claimed in claim 10, wherein said highly resistive material layer comprises an insulation layer.

12. The multi-layer structure as claimed in claim 11, wherein said insulation layer is a silicon oxide layer.

13. The multi-layer structure as claimed in claim 12, further comprising a silicon nitride layer provided between said amorphous silicon layer and said silicon oxide layer.

14. The multi-layer structure as claimed in claim 11, wherein said insulation layer is a silicon nitride layer.

15. The multi-layer structure as claimed in claim 10, wherein said epitaxial silicon layer has a thickness of 1.0 nanometer.

16. The multi-layer structure as claimed in claim 10, wherein said amorphous silicon layer has a thickness of not less than 6 nm and no more than 10 nm.

17. The multi-layer structure as claimed in claim 10, wherein said compound semiconductor active region comprises a first active region and a second active region, and wherein said multi-layer structure is provided on the first active region and a compound semiconductor oxide layer is provided on said second active region and a silicon oxide layer is laminated on the compound semiconductor oxide layer.

* * * * *